(12) United States Patent
D'Addato et al.

(10) Patent No.: US 12,362,734 B2
(45) Date of Patent: Jul. 15, 2025

(54) THRESHOLD VOLTAGE GENERATOR CIRCUIT AND CORRESPONDING RECEIVER DEVICE

(71) Applicants: STMicroelectronics S.r.l., Agrate Brianza (IT); ALMA MATER STUDIORUM—UNIVERSITA' DI BOLOGNA, Bologna (IT)

(72) Inventors: Matteo D'Addato, Sasso Marconi (IT); Alessia Maria Elgani, Pavia (IT); Luca Perilli, Teramo (IT); Eleonora Franchi Scarselli, Bologna (IT); Antonio Gnudi, Bologna (IT); Roberto Antonio Canegallo, Rimini (IT); Giulio Ricotti, Broni (IT)

(73) Assignees: STMicroelectronics S.r.l., Agrate Brianza (IT); Alma Mater Studiorum—Universita' Di Bologna, Bologna (IT)

( * ) Notice: Subject to any disclaimer, the term of this patent is extended or adjusted under 35 U.S.C. 154(b) by 75 days.

(21) Appl. No.: 18/359,465

(22) Filed: Jul. 26, 2023

(65) Prior Publication Data

US 2024/0056060 A1 Feb. 15, 2024

(30) Foreign Application Priority Data

Jul. 28, 2022 (IT) .................. 102022000016017

(51) Int. Cl.
*H03K 5/00* (2006.01)
*H03K 3/0233* (2006.01)
*H03K 5/08* (2006.01)
*H03L 7/099* (2006.01)
(Continued)

(52) U.S. Cl.
CPC ........... *H03K 3/0233* (2013.01); *H03K 5/082* (2013.01); *H03L 7/0995* (2013.01); *H04L 25/06* (2013.01); *H04L 27/06* (2013.01)

(58) Field of Classification Search
CPC .... H03K 3/0233; H03K 5/082; H03L 7/0995; H03L 25/06
See application file for complete search history.

(56) References Cited

U.S. PATENT DOCUMENTS

| 5,404,172 A | * | 4/1995 | Berman | ................. | H04N 7/035 348/E5.017 |
| 5,446,375 A | | 8/1995 | Perkins | | |

(Continued)

FOREIGN PATENT DOCUMENTS

| GB | 2071448 A | 9/1981 |
| WO | 2008028948 A1 | 3/2008 |

OTHER PUBLICATIONS

D'Addato, M., et al., "A Gated Oscillator Clock and Data Recovery Circuit for Nanowatt Wake-Up and Data Receivers," Electronics 2021, vol. 10, Article No. 780, Mar. 25, 2021, 16 pages.

(Continued)

*Primary Examiner* — Tuan T Lam
(74) *Attorney, Agent, or Firm* — Slater Matsil, LLP

(57) ABSTRACT

A circuit includes a clock input node, a first signal input node configured to receive a first modulated signal switching between a first DC voltage and a second DC voltage, a bias circuit, a first output node, a first capacitor, a second capacitor, and switching circuitry coupled to the first capacitor and the second capacitor. Control circuitry is configured to initially set the switching circuitry in a first configuration in response to the first modulated signal having the second DC voltage, thereby charging the first capacitor to the second DC voltage and charging the second capacitor to the first DC voltage, and subsequently set the switching circuitry in a second configuration in response to an edge detected in the clock signal, thereby producing the first threshold voltage at the first output node after charge redis- (Continued)

tribution taking place between the first and second capacitors.

23 Claims, 16 Drawing Sheets

(51) Int. Cl.
  *H04L 25/06* (2006.01)
  *H04L 27/06* (2006.01)

(56) References Cited

U.S. PATENT DOCUMENTS

| | | | | |
|---|---|---|---|---|
| 5,781,588 | A * | 7/1998 | Abe | H03G 3/3068 |
| | | | | 375/345 |
| 5,900,749 | A * | 5/1999 | Hendrickson | H04L 25/065 |
| | | | | 327/552 |
| 6,249,556 | B1 | 6/2001 | Rees et al. | |
| 7,541,845 | B2 * | 6/2009 | Noh | H04L 25/062 |
| | | | | 327/91 |
| 11,088,677 | B1 * | 8/2021 | Wu | H03F 3/45 |
| 2003/0043935 | A1 | 3/2003 | Noh | |
| 2007/0238432 | A1 | 10/2007 | Miyasita et al. | |
| 2012/0049949 | A1 | 3/2012 | Nito et al. | |
| 2017/0288568 | A1 * | 10/2017 | Grasso | H02M 7/219 |

OTHER PUBLICATIONS

Elhebeary, M., et al., "An 8.5pJ/bit Ultra-Low Power Wake-Up Receiver Using Schottky Diodes for IoT Applications," IEEE 45th European Solid State Circuits Conference (ESSCIRC), Sep. 23, 2019, pp. 205-208.

Hsieh, M, et al., "Architectures for Multi-Gigabit Wire-Linked Clock and Data Recovery," IEEE Circuits and Systems Magazine, vol. 8, Issue 4, Dec. 9, 2008, pp. 45-57.

Moody, J., et al., "Interference Robust Detector-First Near-Zero Power Wake-Up Receiver," IEEE Journal of Solid-State Circuits, vol. 54, No. 8, Aug. 2019, pp. 2149-2162.

Roberts, N., et al., "A 236nW-56.5dBm-Sensitivity Bluetooth Low-Energy Wakeup Receiver with Energy Harvesting in 65 nm CMOS," 2016 IEEE International Solid-State Circuits Conference, Session 26, Feb. 3, 2016, 3 pages.

Sadagopan, K., et al., "A 365 nW-61.5 dBm Sensitivity, 1.875 cm2 2.4 GHz Wake-up Receiver with Rectifier-Antenna Co-design for Passive Gain," 2017 IEEE Radio Frequency Integrated Circuits Symposium (RFIC), Jun. 4-6, 2017, pp. 180-183.

Wong, Koon Lun Jackie, et al., "A 20 μV/°C. Digital Offset Compensation Technique for Comparators and Differential Amplifiers," IEEE Asian Solid-State Circuits Conference; Nov. 12-14, 2012; Kobe, Japan; 4 pages.

* cited by examiner

US 12,362,734 B2

THRESHOLD VOLTAGE GENERATOR CIRCUIT AND CORRESPONDING RECEIVER DEVICE

CROSS-REFERENCE TO RELATED APPLICATIONS

This application claims the priority benefit of Italian patent application number 102022000016017, filed on Jul. 28, 2022, which is hereby incorporated by reference to the maximum extent allowable by law.

TECHNICAL FIELD

The description relates to threshold generator circuits for use with comparator circuits. One or more embodiments may be applied, for instance, to receiver devices for communication systems.

BACKGROUND

FIG. 1 is a circuit block diagram exemplary of components of a receiver device 5 for use in a communication system. Reference documents by Hsieh (Hsieh, M.; Sobelman, G.: "Architectures for Multi-Gigabit Wire-Linked Clock and Data Recovery," IEEE Circuits and Systems Magazine, December 2008, vol. 8, pp. 45-57, doi: 10.1109/MCAS.2008.930152), D'Addato (D'Addato, M.; Elgani, A. M.; Perilli, L.; Franchi Scarselli, E.; Gnudi, A.; Canegallo, R.; Ricotti, G.: "A Gated Oscillator Clock and Data Recovery Circuit for Nanowatt Wake-Up and Data Receivers," Electronics 2021, vol. 10, article no. 780, doi: 10.3390/electronics10070780), and Elhebeary (Elhebeary, M.; Chen, L.-Y.; Pamarti, S.; KenYang, C.-K.: "An 8.5 pJ/bit Ultra-Low Power Wake-Up Receiver Using Schottky Diodes for IoT Applications," ESSCIRC 2019-IEEE 45th European Solid State Circuits Conference (ESSCIRC), 2019, pp. 205-208, doi: (hereinafter "the Elhebeary paper") are also exemplary of receiver architectures known in the art.

In particular, the receiver device 5 includes analog-to-digital conversion circuitry configured to produce a digital data signal Din as a function of an input analog signal $V_d$. For instance, the receiver device 5 may be a wireless receiver including an antenna (not visible in FIG. 1) and an analog front end (AFE) circuit (not visible in FIG. 1) coupled to the antenna to receive therefrom a modulated signal conveying a stream of data bits. For instance, the analog front end circuit may include an envelope detector configured to detect the envelope of an amplitude-modulated signal received by the antenna (e.g., an on-off keying (OOK) modulated signal). The analog front end circuit thus produces an envelope signal $V_d$ that is fed to the input nodes 502 and 504 of an inverting analog amplifier circuit 50, and is indicative of a sequence of bits TS (refer also to FIG. 2) transmitted by a transmitter device (not visible in FIG. 1).

The voltage at node 502 (e.g., a positive input of amplifier 50) is indicated herein as $v_p$ and the voltage at node 504 (e.g., a negative input of amplifier 50) is indicated herein as $v_m$, so that $V_d = v_p - v_m$. The amplifier circuit 50 thus receives the envelope signal $V_d$ and produces an amplified output signal $V_{amp}$, possibly inverting the polarity of signal $V_d$ so that a high value of signal $V_{amp}$ is indicative of a '0' bit and a low value of signal $V_{amp}$ is indicative of a '1' bit in the received sequence TS. The amplified signal $V_{amp}$ thus switches between a first (e.g., high) DC value $V_{dc}$ and a second (e.g., low) value that is equal to $V_{dc}$ minus the amplitude of signal $V_{amp}$ (e.g., the output swing of amplifier 50), which in turn depends on the amplitude of the received envelope signal $V_d$.

Alternatively, in case the amplifier 50 is a non-inverting one, the second output value is higher than the DC value $V_{dc}$ (i.e., it is equal to $V_{dc}$ plus the amplitude of signal $V_{amp}$). The amplified signal $V_{amp}$ is fed to a first (e.g., inverting) input of a comparator circuit 52, while the second (e.g., non-inverting) input of comparator circuit 52 receives a threshold voltage $V_{th}$. The comparator 52 compares signal $V_{amp}$ to voltage $V_{th}$ and produces a digital data signal Din as a function of the comparison. For instance, signal Din may be asserted (e.g., set to a high logic value, '1') if $V_{amp}<V_{th}$ and de-asserted (e.g., set to a low logic value, '0') if $V_{amp}>V_{th}$.

Additionally, the receiver device 5 may include any kind of digital system or circuit 54 clocked by a clock signal Clk (e.g., a system clock) having period $T_{ck}$ produced by an oscillator circuit or clock generator circuit 56. The digital circuit 54 may thus receive the digital data signal Din and process it as requested by the application. The oscillator circuit 56 may include, for instance, a clock and data recovery (CDR) circuit, or a phase-locked loop (PLL) circuit, or a crystal oscillator. In particular, a gated-oscillator CDR circuit (GO-CDR) may be advantageous since it facilitates carrying out the analog-to-digital conversion without the need of implementing an always-on clock, and it facilitates sampling of the digital signal Din since it generates a clock signal whose phase and frequency are aligned with signal Din.

FIG. 2 is a time diagram exemplary of possible time evolution of signals in the receiver device 5 of FIG. 1, when the received bit sequence TS includes a bit stream equal to '10101100'. The target (e.g., expected) duration of each bit of the received sequence (bit time) is indicated with $T_b$. In addition, in FIG. 2 two possible waveforms of signal $V_{amp}$ are exemplified: in a first case (exemplified by a solid line), the amplitude of signal $V_{amp}$ is equal to $A_0$ and the low value of signal $V_{amp}$ is equal to $V_{dc}-A_0$; in a second case (exemplified by the dotted line), the amplitude of signal $V_{amp}$ is equal to $A_1$ and the low value of signal $V_{amp}$ is equal to $V_{dc}-A_1$, with $A_1>A_0$ or even $A_1 \gg A_0$. $A_0$ may be the amplitude corresponding to the minimum detectable signal.

In particular, FIG. 2 is exemplary of a case where the rising time $\tau_r$ and the falling time $\tau_f$ of the amplifier output (i.e., of signal $V_{amp}$) are negligible with respect to the bit time $T_b$. In this case, any arbitrary value of the threshold voltage $V_{th}$ included between the minimum value and the maximum value of signal $V_{amp}$ can be used (e.g., $V_{th}=V_{dc}-(A_0/2)$) without affecting substantially the duration of the received zero $T_{b0}$ and the duration of the received one $T_{b1}$, which will both be approximately equal to the expected bit duration $T_b$ (i.e., $T_{b0} \approx T_b$ and $T_{b1} \approx T_b$) even if $\tau_r \neq \tau_f$ or $A_1 \gg A_0$. Assuming that $T_{ck}=T_b$, the digital system 54 clocked by signal Clk can correctly sample the received data signal Din in the middle of the bit time. However, achieving a low rising time $\tau_r$ and a low falling time $\tau_f$ of the output of amplifier 50 implies a high consumption of power.

FIG. 3 is a time diagram exemplary of possible time evolution of signals in the receiver device 5 of FIG. 1, again in an example case where the received sequence TS includes a bit stream equal to '10101100'. In particular, FIG. 3 is exemplary of a case where the rising time $\tau_r$ and the falling time $\tau_f$ of the output of amplifier 50 are not negligible with respect to the bit time $T_b$, and the amplitude of signal $V_{amp}$ is equal to $A_0$ ($A_0$ being the amplitude corresponding to the minimum detectable signal). Assuming that $T_{ck}=T_b$, if the bit time of the received signal has a different duration in case of reception of a '1' or a '0', the received bit could be oversampled or not sampled at all. In this case, in order to avoid oversampling or missing any bit (e.g., in order to achieve a condition where $T_{b0} \approx T_b$ and $T_{b1} \approx T_b$), it is not possible to use any arbitrary value of the threshold voltage $V_{th}$; rather, adjustment of the comparator threshold $V_{th}$ may be resorted to. In particular, if the amplitude of signal $V_{amp}$ is equal to $A_0$ as exemplified in FIG. 3, the comparator threshold $V_{th}$ may be set to $V_{th}=V_{dc}-(A_0/2)$. By doing so, the digital system 54 clocked by signal Clk can correctly sample the received data signal Din in the middle of the bit time.

FIG. 4 is a time diagram exemplary of possible time evolution of signals in the receiver device 5 of FIG. 1, again in an example case where the received sequence includes a bit stream equal to '10101100'. In particular, FIG. 4 is exemplary of a case where the rising time $\tau_r$ and the falling time $\tau_r$ of the amplifier output are not negligible with respect to the bit time $T_b$, and the amplitude of signal $V_{amp}$ is equal to $A_1$ with $A_1 \gg A_0$ ($A_0$ being the amplitude corresponding to the minimum detectable signal). Again, assuming that $T_{ck}=T_b$, if the bit time of the received signal has a different duration in case of reception of a '1' or a '0', the received bit could be oversampled or not sampled at all. In this case, in order to achieve a condition where $T_{b0} \approx T_b$ and $T_{b1} \approx T_b$, it is not possible to use any arbitrary value of the threshold voltage $V_{th}$; again, adjustment of the comparator threshold $V_{th}$ may be resorted to. In particular, since the amplitude of signal $V_{amp}$ is equal to $A_1 \gg A_0$, the comparator threshold voltage $V_{th}$ should be set to a value that depends on the amplitude $A_1$ in order for the digital system 54 clocked by signal Clk to correctly sample the received data signal Din in the middle of the bit time. For instance, the comparator threshold voltage $V_{th}$ can be set to a value intermediate the minimum and maximum values of signal $V_{amp}$, such as $V_{th}=V_{ac}-(A_1/2)$. If, instead, the "default" value $V_{th}=V_{dc}-(A_0/2)$ is used, the duration of the received zero $T_{b0}$ and the duration of the received one $T_{b1}$ may differ from the expected bit duration $T_b$ as exemplified in FIG. 4, possibly resulting in incorrect sampling of the data signal Din.

Therefore, if the rising time $\tau_r$ and the falling time $\tau_f$ of the output of amplifier 50 are not negligible with respect to the bit time $T_b$, adjustment of the comparator threshold $V_{th}$ may be used in order to achieve a condition where $T_{b0} \approx T_b$ and $T_{b1} \approx T_b$, which in turn allows the digital system 54 clocked by signal Clk to correctly sample the received data signal Din in the middle of the bit time.

Some solutions for generating the threshold voltage $V_{th}$ for comparator 52 have been proposed in the field of ultra-low-power wake-up radio (WUR) receivers. For instance, solutions proposed in reference documents to Roberts (Roberts, N. E.; Craig, K.; Shrivastava, A.; Wooters, S. N.; Shakhsheer, Y.; Calhoun, B. H.; Wentzloff, D. D.: "A 236 nW-56.5 dBm-Sensitivity Bluetooth Low-Energy Wakeup Receiver with Energy Harvesting in 65 nm CMOS", 2017) (hereinafter "the Roberts paper"), Sadagopan (Sadagopan, K. R.; Kang, J.; Jain, S.; Ramadass, Y.; Natarajan, A.: "A 365 nW-61.5 dBm sensitivity, 1.875 cm2 2.4 GHz wake-up receiver with rectifier-antenna co-design for passive gain," 2017 IEEE Radio Frequency Integrated Circuits Symposium (RFIC), 2017, pp. 180-183, doi: 10.1109/RFIC.2017.7969047) (hereinafter "Sadagopan"), and Moody (Moody, J.; Bassirian, P.; Roy, A.; Liu, N.; Barker, N. S.; Calhoun, B. H.; Bowers, S. M.: "Interference Robust Detector-First Near-Zero Power Wake-Up Receiver," in IEEE Journal of Solid-State Circuits, vol. 54, no. 8, pp. 2149-2162, August 2019, doi: 10.1109/JSSC.2019.2912710) (hereinafter "the Moody paper") enable an adaptive threshold generation (using variable gain amplifiers (VGAs) and architectures for updating the threshold voltage $V_{th}$), but require always-on clocks and imply non-negligible preamble times to properly set the value of the threshold voltage $V_{th}$. The gain of the VGA is conventionally adjusted during the calibration phase, based on a target signal.

In particular, the Roberts paper discloses a solution where the comparator is clocked, which requires an always-on clock circuit. Additionally, the comparator threshold is generated by an RC filter, which results in a non-negligible time to properly set the threshold value, thus affecting the preamble time duration. Additionally, the solution disclosed in the Roberts paper requires large RC values to result in ultra-low-power consumption and data encoding with limited number of consecutive ones or zeros. The comparator offset is programmable with weighting bits based on the interference levels. If a consecutive number of ones or zeros is detected, an automatic offset controller raises or lowers the effective comparator threshold, which entails additional time to adjust the comparator offset.

The Sadagopan paper discloses a solution where the comparator is clocked, which requires an always-on clock circuit. Additionally, the comparator threshold is generated as a function of the received signal amplitude through a programmable resistive ladder with an off-chip control loop by targeting 50% ones and zeros in the comparator output, which also results in a non-negligible time to properly set the comparator threshold value.

The Moody paper also discloses a solution where the comparator is clocked, which requires an always-on clock circuit. Additionally, the effective threshold of the comparator is controlled through an offset-control algorithm, which updates the offset during the reception of the data packet. Therefore, also according to this solution, a non-negligible time to properly set the comparator threshold value is needed.

The Elhebeary paper discloses a solution where the gain of a variable-gain amplifier is adjusted during the calibration phase. It relies on a clock-less comparator, so it does not require an always-on clock, but includes an RC filter to generate the amplifier bias voltage. It therefore implies large preamble times, and data encoding is limited as far as the number of consecutive ones and zeros is concerned. Additionally, the solution disclosed in the Elhebeary paper relies on variable size inverters to control the threshold level detecting the ones or zeros, so the comparator threshold voltage is adjusted during the calibration phase according to the expected received signal amplitude. As a result, the comparator threshold cannot be adjusted during the reception of data packets.

SUMMARY

One or more embodiments disclosed herein can provide improved threshold generator circuits for use with comparator circuits for application, e.g., to receiver devices for communication systems. Thus, one or more embodiments can contribute in providing improved threshold voltage generator circuits.

One or more embodiments may relate to a corresponding receiver device.

According to a first aspect, a threshold voltage generator circuit includes a clock input node configured to receive a clock signal, a first signal input node configured to receive a first modulated signal switching between a first DC voltage and a second DC voltage, a bias circuit configured to produce a bias voltage equal to the first DC voltage, a first output node configured to produce a first threshold voltage, a first capacitor, a second capacitor, and first switching circuitry coupled to the first capacitor and the second capacitor. The first switching circuitry is switchable between a first configuration, where a first terminal of the first capacitor is coupled to the first signal input node, a first terminal of the second capacitor is coupled to the bias circuit, and the first terminals of the first and second capacitors are decoupled from each other; and a second configuration, where the first terminal of the first capacitor is decoupled from the first signal input node, the first terminal of the second capacitor is decoupled from the bias circuit, and the first terminals of the first and second capacitors are coupled to each other and to the first output node. The circuit further includes control circuitry configured to initially set the first switching circuitry in the first configuration in response to the first modulated signal having the second DC voltage, thereby charging the first capacitor to the second DC voltage and charging the second capacitor to the first DC voltage, and subsequently set the first switching circuitry in the second configuration in response to an edge detected in the clock signal, thereby producing the first threshold voltage at the first output node after charge redistribution taking place between the first and second capacitors.

One or more embodiments may thus provide a solution for producing a threshold voltage for a comparator in a receiver device in which the value of the threshold voltage is generated rapidly and adaptively at the beginning of reception of a modulated signal.

According to another aspect, a receiver device includes a threshold voltage generator circuit according to one or more embodiments and configured to produce a first threshold voltage; a pair of nodes configured to receive therebetween an envelope signal indicative of a sequence of data bits; an amplifier circuit coupled to the pair of nodes to receive the envelope signal and configured to produce, as a function thereof, the first modulated signal switching between the first DC voltage and the second DC voltage; a comparator circuit configured to compare the first modulated signal to the first threshold voltage to produce a digital data signal indicative of the sequence of data bits; and an oscillator circuit configured to produce the clock signal received at the clock input node of the threshold voltage generator circuit.

BRIEF DESCRIPTION OF THE FIGURES

One or more embodiments will now be described, by way of example only, with reference to the annexed figures, wherein.

DETAILED DESCRIPTION OF EXEMPLARY EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
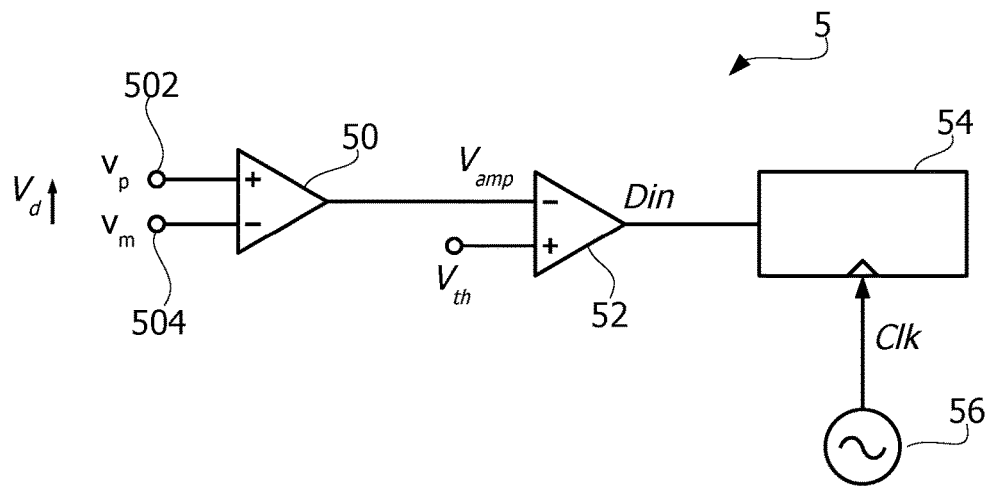
FIG. 1 is a circuit block diagram exemplary of a receiver device for use in a communication system, the receiver device including a digital circuit clocked by an oscillator circuit and related analog-to-digital conversion circuitry.
Figure 2:
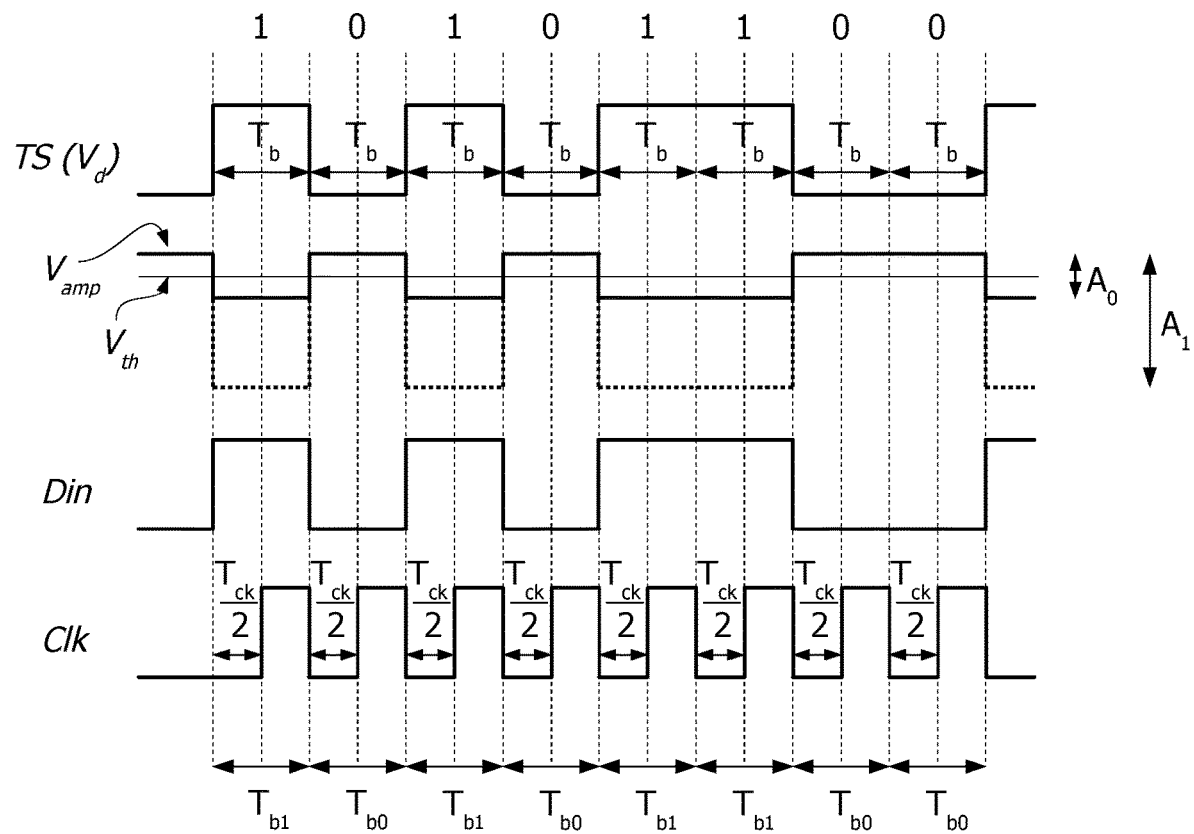
FIG. 2 is a time diagram exemplary of possible time evolution of signals in the receiver device of FIG. 1 in a case where the rising time and the falling time of the amplifier output signal are negligible with respect to the bit time.
Figure 3:
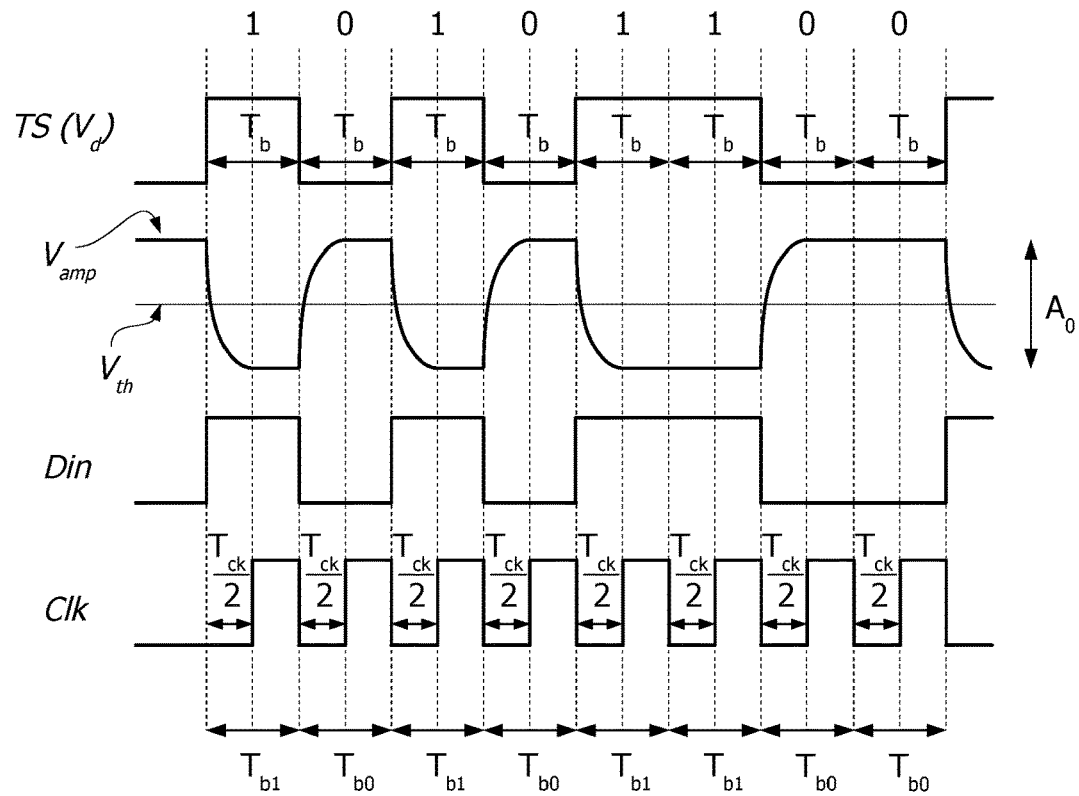
FIG. 3 is a time diagram exemplary of possible time evolution of signals in the receiver device of FIG. 1 in a case where the rising time and the falling time of the amplifier output signal are not negligible with respect to the bit time, and the comparator threshold voltage is compatible with the amplitude of the amplifier output signal.
Figure 4:
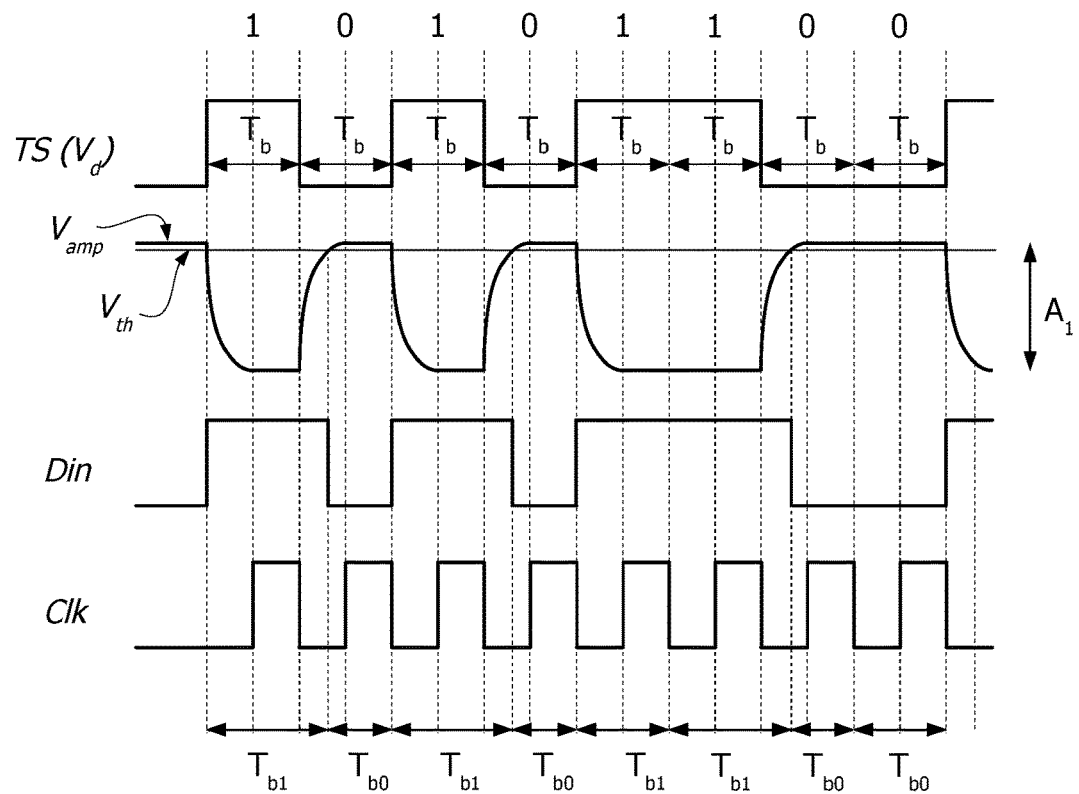
FIG. 4 is a time diagram exemplary of possible time evolution of signals in the receiver device of FIG. 1 in a case where the rising time and the falling time of the amplifier output signal are not negligible with respect to the bit time, and the comparator threshold voltage is not adjusted to the amplitude of the amplifier output signal.
Figure 5:
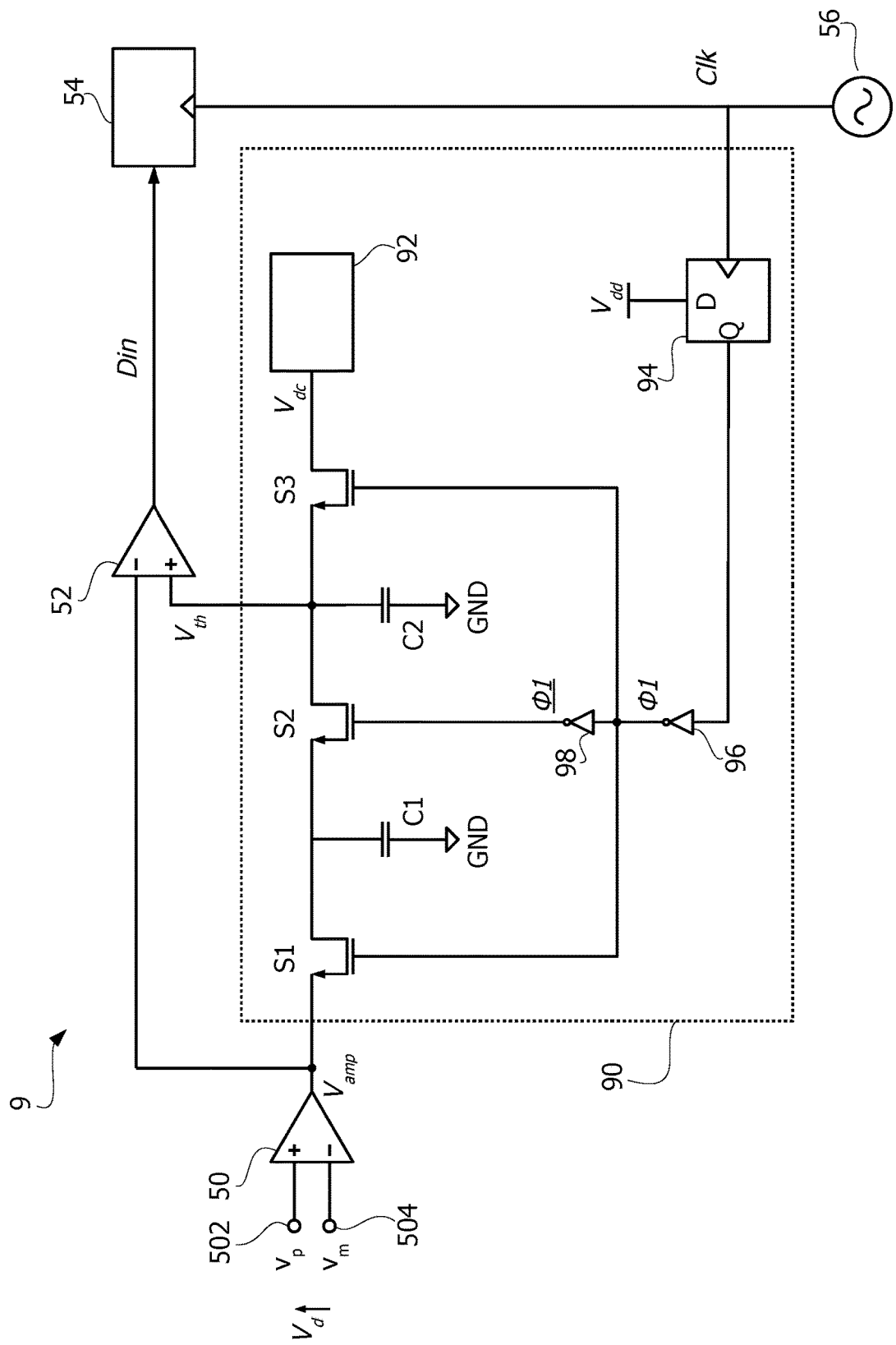
FIG. 5 is a circuit block diagram exemplary of a receiver device for use in a communication system, the receiver device including a threshold voltage generator circuit according to one or more embodiments of the present description.

FIG. 5 is a circuit block diagram exemplary of components of a receiver device 9 according to one or more embodiments, e.g., for use in a communication system. In particular, the receiver device 9 includes analog-to-digital conversion circuitry configured to produce a digital data signal Din as a function of an input analog signal $V_d$ (e.g., an envelope signal), and a digital system or circuit 54 clocked by clock signal Clk (e.g., a system clock) produced by an oscillator circuit 56, according to an architecture similar to the architecture previously discussed with reference to FIG. 1.

The analog-to-digital conversion circuitry of receiver device 9 includes a comparator threshold voltage generator circuit 90 configured to generate the comparator threshold voltage $V_{th}$ for comparator 52 as a function of the amplifier output voltage $V_{amp}$, e.g., by resorting to a sample-and-hold architecture.

In particular, the threshold voltage generator circuit 90 includes a first capacitor C1 (e.g., an integrated capacitor), a second capacitor C2 (e.g., an integrated capacitor), a first switch S1, a second switch S2 and a third switch S3. Capacitors C1 and C2 may have the same capacitance value. Switch S1 (e.g., a transistor, optionally a MOS transistor, optionally an n-channel MOS transistor) has a first terminal connected to the output terminal of amplifier 50 and a second terminal connected to a first terminal of capacitor C1. Switch S1 is controlled by a control signal Φ1, e.g., it is closed (conductive) when signal Φ1 is asserted (e.g., set to a high logic value, '1') and open (non-conductive) when signal Φ1 is de-asserted (e.g., set to a low logic value, '0'). Therefore, switch S1 is configured to couple the first terminal of capacitor C1 to the output terminal of amplifier 50 to receive voltage $V_{amp}$ when signal Φ1 is asserted and decouple the first terminal of capacitor C1 from the output terminal of amplifier 50 when signal Φ1 is de-asserted.

The second terminal of capacitor C1 is connected to a ground node GND. Switch S2 (e.g., a transistor, optionally a MOS transistor, optionally an n-channel MOS transistor) has a first terminal connected to the first terminal of capacitor C1 and a second terminal connected to a first terminal of capacitor C2. Switch S2 is controlled by the complement Φ1 of control signal Φ1 (underlining is used herein to indicate a complement or inverted signal), e.g., it is closed (conductive) when signal Φ1 is asserted (e.g., set to a high logic value, '1') and open (non-conductive) when signal Φ1 is de-asserted (e.g., set to a low logic value, '0'). Therefore, switch S2 is configured to couple the first terminal of capacitor C2 to the first terminal of capacitor C1 when signal Φ1 is asserted and decouple the first terminal of capacitor C2 from the first terminal of capacitor C1 when signal Φ1 is de-asserted.

The second terminal of capacitor C2 is connected to ground node GND. Switch S3 (e.g., a transistor, optionally a MOS transistor, optionally an n-channel MOS transistor) has a first terminal connected to the first terminal of capacitor C2 and a second terminal connected to a bias source 92 to receive voltage $V_{dc}$ that is equal to the DC output voltage of amplifier 50. For instance, the bias source 92 may include a replica of the amplifier circuit 50 that is configured to produce (e.g., constantly) an output voltage $V_{dc}$ equal to the DC output voltage of the amplifier 50. Switch S3 is controlled by control signal Φ1, e.g., it is closed (conductive) when signal Φ1 is asserted (e.g., set to a high logic value, '1') and open (non-conductive) when signal Φ1 is de-asserted (e.g., set to a low logic value, '0').

Therefore, switch S3 is configured to couple the first terminal of capacitor C2 to the bias source 92 to receive voltage $V_{dc}$ when signal Φ1 is asserted and decouple the first terminal of capacitor C2 from the bias source 92 when signal Φ1 is de-asserted. Comparator 52 has a first (e.g., inverting) input connected to the output terminal of amplifier 50 to receive signal $V_{amp}$, and a second (e.g., non-inverting) input connected to the first terminal of capacitor C2 to receive the threshold voltage $V_{th}$ produced at that node.

Additionally, the threshold voltage generator circuit 90 includes control circuitry configured to generate the control signals Φ1 and Φ1 for producing the threshold voltage $V_{th}$ for comparator 52. The control circuitry may be configured to initially assert (e.g., before the start of reception of a data packet or bit stream) signal Φ1, de-assert signal Φ1 upon detecting a first edge in the clock signal Clk during the first received bit of the data packet, and maintain signal Φ1 de-asserted for the entire duration of the received data packet. Therefore, switches S1 and S3 operate synchronously with each other (e.g., in phase), while switch S2 operates in anti-phase with respect to switches S1 and S3. The threshold voltage generator circuit 90 can switch between two possible configurations: Φ1='1' and Φ1='0', or Φ1='0' and Φ1=1.

FIG. 5 is exemplary of a possible implementation of control circuitry that produces signals Φ1 and Φ1. The control circuitry may include a register 94 (e.g., a D flip-flop) having a clock input terminal configured to receive the clock signal Clk (i.e., the oscillator circuit 56 may be shared between the threshold voltage generator circuit 90 and the digital circuit 54), a data input terminal D configured to receive a voltage that is interpreted as a high logic value (e.g., a supply voltage $V_{dd}$), and a data output terminal Q configured to transfer the input to the output in response to the pulses of signal Clk. The control circuitry may include a first inverter circuit 96 arranged between the output terminal Q of register 94 and the control terminals of switches S1 and S3 to produce the control signal Φ1, and a second inverter circuit 98 arranged between the output terminal of inverter 96 and the control terminal of switch S2 to produce the control signal Φ1.

Figure 6:
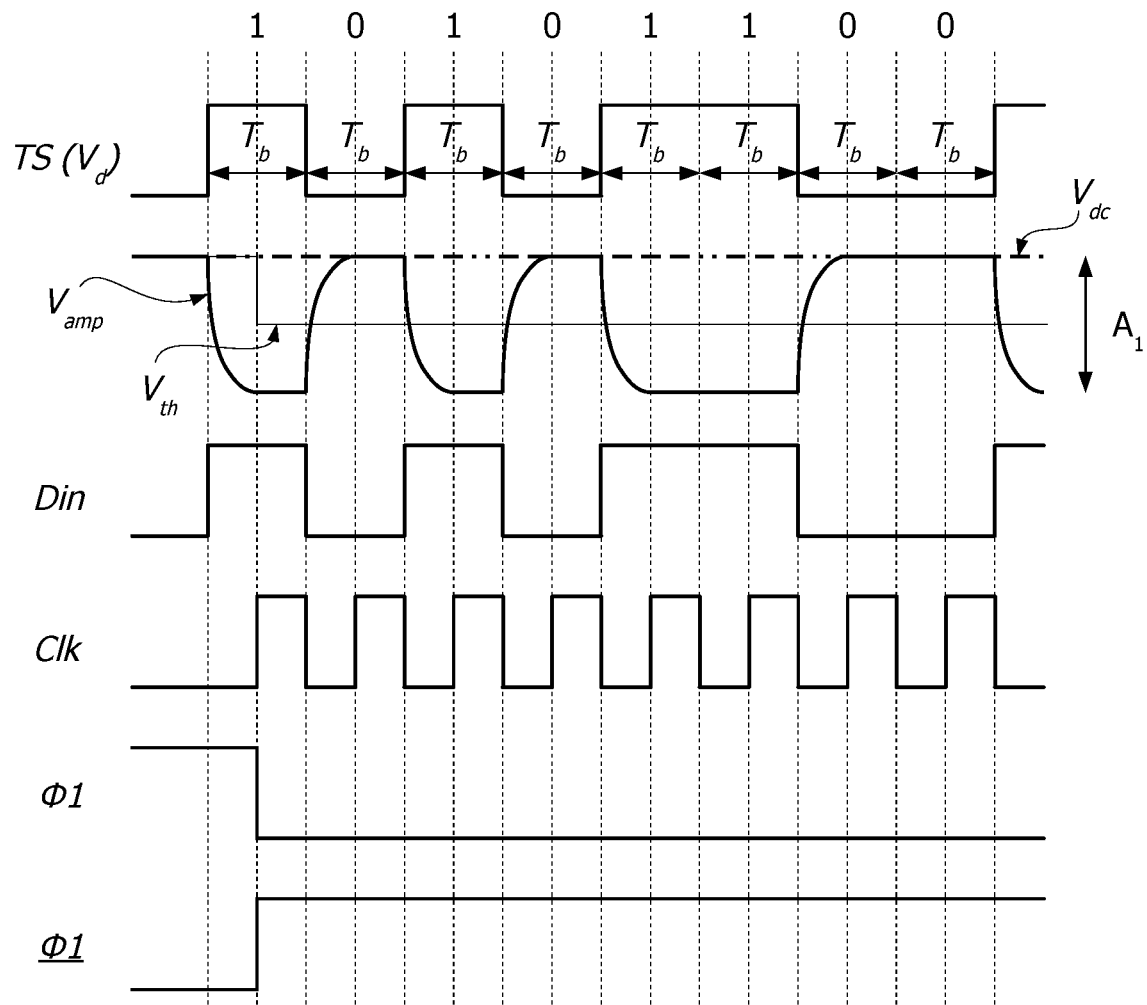
FIG. 6 is a time diagram exemplary of possible time evolution of signals in the receiver device of FIG. 5.

Operation of receiver device 9 and threshold voltage generator circuit 90 may be further understood with reference to FIG. 6, which is a time diagram exemplary of possible time evolution of signals in the receiver device 9 of FIG. 5. The operating principle is that the threshold voltage $V_{th}$ is generated during the first received bit of the data packet TS by producing across capacitors C1 and C2 a voltage corresponding to the average of the maximum (e.g., $V_{dc}$) and minimum (e.g., $V_{dc}-A_1$) values output by amplifier 50 during the first bit time $T_b$ (e.g., $V_{th}=V_{dc}-A_1/2$). It is otherwise noted that, if the amplifier 50 were a non-inverting amplifier, the maximum and minimum values output by amplifier 50 would be respectively $V_{dc}+A_1$ and $V_{dc}$, and $V_{th}$ would be the average therebetween (e.g., $V_{th}=V_{dc}+A_1/2$).

Initially, signal Φ1 is asserted and signal Φ1 is de-asserted. Capacitor C1 is coupled to the output of amplifier 50 and follows the variations of voltage $V_{amp}$. Capacitor C2 is coupled to the bias source 92 and is charged at voltage $V_{dc}$ that is constant and equal to the DC (e.g., maximum) value of voltage $V_{amp}$ output by amplifier 50 (or minimum value, if amplifier 50 in a non-inverting one), so that $V_{th}=V_{dc}$. This condition enables comparator 52 to detect the first transition of signal $V_{amp}$, which may be useful to trigger on the oscillator circuit 56 to produce the clock signal Clk in case the oscillator 56 is not an always-on oscillator (e.g., if oscillator 56 is a GO-CDR).

Right before the first edge of clock signal Clk, (i.e., in the middle of the first bit time $T_b$), capacitor C1 is charged to the minimum value of voltage $V_{amp}$ output by amplifier 50 (e.g., $V_{dc}+A_1$) and capacitor C2 is charged to voltage $V_{dc}$. At the first clock edge, the threshold voltage generator circuit 90 switches to the configuration where signal Φ1 is de-asserted and signal Φ1 is asserted, which is maintained until the end of the communication. In this configuration, capacitors C1 and C2 are coupled in parallel and decoupled from amplifier 50 and bias source 92, so that charge redistribution takes place between them. Having capacitors C1 and C2 the same capacitance value, the voltage $V_{th}$ across them when coupled in parallel is equal to the average between the maximum and minimum values of $V_{amp}$ (e.g., $V_{th}=V_{dc}-(A_1/2)$).

The configuration where signal Φ1 is de-asserted and signal Φ1 is asserted may be maintained until a whole data packet has been received (e.g., until end of communication), and the threshold voltage generator circuit 90 may switch back to the configuration where signal Φ1 is asserted and signal Φ1 is de-asserted after the end of communication.

Therefore, in one or more embodiments as exemplified in FIG. 5, the threshold voltage $V_{th}$ for comparator 52 may be generated as a function of (e.g., as the average of) the maximum and minimum amplitude of signal $V_{amp}$ during the first received bit. However, it is noted that the voltage $V_{th}$ across the parallel-connected capacitors C1 and C2 may (slowly) decrease during reception of a data packet (e.g., due to leakage). By increasing the capacitance value of capacitors C1 and C2, the maximum receivable packet length may be increased, but a trade-off between the current supplied by the amplifier 50 and the maximum receivable packet length should be considered.

Purely by way of example, one or more embodiments as exemplified in FIG. 5 may provide the following performance in a 90-nm CMOS technology from STMicroelectronics: at a supply voltage of 0.6 V and a data bit rate of 1 kbit/s, power consumption of the receiver device 9 may be in the order of 13.5 nW and, using capacitors C1 and C2 with capacitance equal to 1 pF, the maximum receivable packet length may be about 140 bits. The maximum number of receivable consecutive zeros, as well as the maximum number of receivable consecutive ones, may also be about 140 bits.

It is noted that the trade-off between the current supplied by the amplifier 50 and the capacitance value of capacitors C1 and C2 takes place since an increase in the capacitance value implies an increase in the transient times (rising and/or falling times) of the amplifier output signal $V_{amp}$. In particular, this occurs if the output current of the amplifier 50 is kept constant while the capacitance value of capacitors C1 and C2 is increased. One or more embodiments may mitigate this issue (e.g., may aim at keeping the duration of the transient times unchanged when the capacitance value of capacitors C1 and C2 is increased) by increasing the value of the current supplied by amplifier 50 as a function of (e.g., proportionally to) the capacitance value. Since the bias source 92 is a replica of the amplifier circuit 50, the bias current of bias source 92 may also be controlled accordingly.

Figure 7:
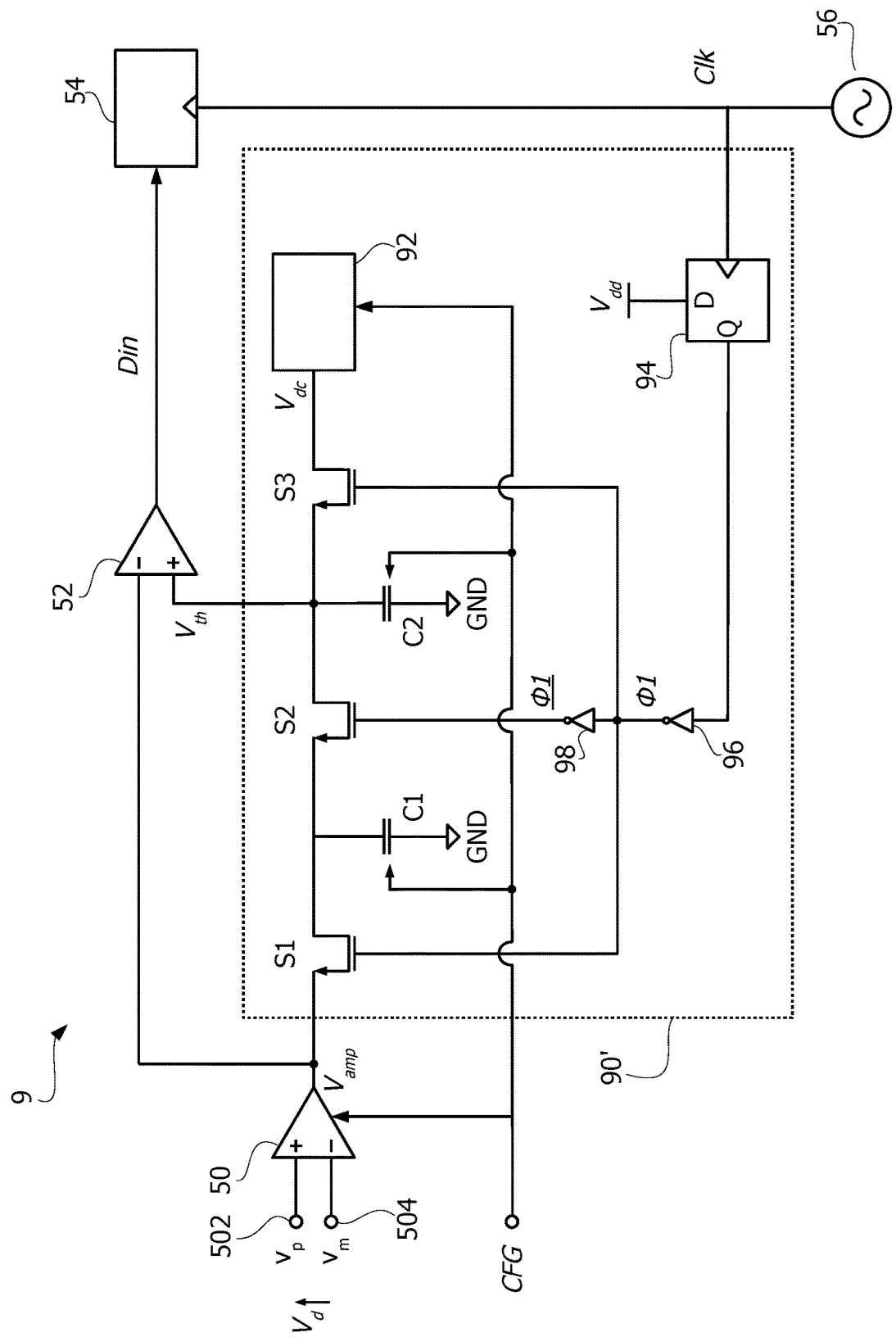
FIG. 7 is a circuit block diagram exemplary of a receiver device for use in a communication system, the receiver device including a configurable threshold voltage generator circuit according to one or more embodiments of the present description.

For instance, in one or more embodiments as exemplified in FIG. 7, the capacitance value of capacitors C1 and C2, the current supplied by the amplifier 50 and the current supplied by the bias source 92 can be programmable as a function of a configuration signal CFG (e.g., one or more configuration bits). For example, the DC bias currents of amplifier 50 and bias source 92 may be made variable through programming bits of signal CFG. Similarly, the capacitance of capacitors C1 and C2 may be made programmable through programming bits of signal CFG. In particular, the capacitance value and the bias currents may be made programmable as a function of the desired maximum length of a receivable data packet.

Therefore, one or more embodiments as exemplified in FIGS. 5 and 7 may provide one or more of the following advantages. The comparator threshold voltage generation circuitry facilitates fast and adaptive generation of the threshold voltage $V_{th}$ that is fed to the analog comparator 52 that produces the input data signal Din for the digital circuit 54. In particular, the threshold voltage $V_{th}$ may be generated within the bit time of the first received bit of a data stream to accommodate, for example, also the short settling time of a gated oscillator-based clock and data recovery circuit (GO-CDR) operating in burst mode.

Therefore, the receiver device may not exhibit long preamble times, insofar as no preamble may be needed. In one or more embodiments, the threshold voltage $V_{th}$ may be automatically generated according to the amplitude of the received signal $V_{amp}$, so that a variable gain amplifier may not be needed. In one or more embodiments, the threshold voltage $V_{th}$ may be generated without resorting to an always-on clock, thereby reducing power consumption of the receiver device; the clock may be used only during reception of a data packet. In one or more embodiments, the threshold voltage generation circuitry may advantageously not include resistors. In one or more embodiments, the capacitance values of capacitors C1 and C2 included in the threshold voltage generation circuitry may be programmable (e.g., by providing a capacitive network configurable via respective configuration switches controlled by configuration bits of signal CFG), e.g., as a function of the target data packet length. In one or more embodiments, the threshold voltage generation circuitry may be temperature and/or voltage compensated, insofar as the value of the threshold voltage $V_{th}$ is determined at the beginning of reception of a data packet.

As previously discussed, embodiments as exemplified in FIGS. 5 and 7 may involve a trade-off between the capacitance value of capacitors C1 and C2 (which is related to the current supplied by the amplifier 50) and the maximum receivable data packet length. It is noted that by refreshing the voltage across capacitors C1 and C2 during reception of a data packet, longer data packets can be received and correctly sampled without the need of increasing the capacitance of capacitors C1 and C2. Therefore, one or more embodiments as exemplified in FIG. 8 may include a threshold voltage refresh circuit arrangement.

Figure 8:
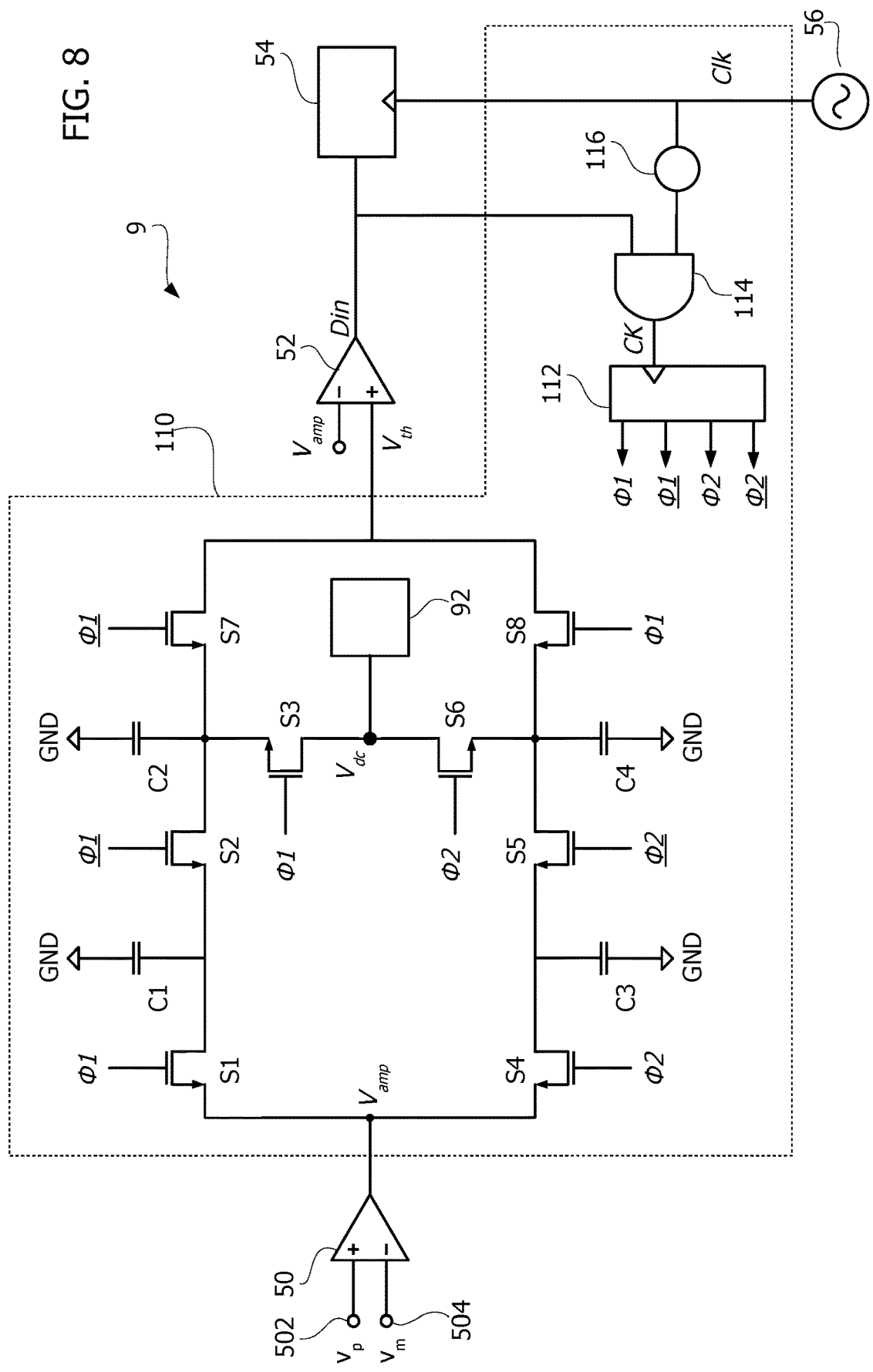
FIG. 8 is a circuit block diagram exemplary of a receiver device for use in a communication system, the receiver device including a threshold voltage generator circuit with refresh capability according to one or more embodiments of the present description.

FIG. 8 is a circuit block diagram exemplary of components of a receiver device 9 according to one or more embodiments, e.g., for use in a communication system. Similarly to the embodiments exemplified in FIG. 5, receiver device 9 includes analog-to-digital conversion circuitry configured to produce a digital signal Din as a function of an input analog signal $V_d$ (e.g., an envelope signal), and a digital system or circuit 54 clocked by clock signal Clk (e.g., a system clock) produced by an oscillator circuit 56, according to an architecture similar to the architecture previously discussed with reference to FIG. 1.

The analog-to-digital conversion circuitry of receiver device 9 includes a comparator threshold voltage generator circuit no configured to generate the comparator threshold voltage $V_{th}$ for comparator 52 as a function of the amplifier output voltage $V_{amp}$ by resorting to a sample-and-hold architecture with voltage refresh capability. The architecture of FIG. 8 substantially includes two instances of the same switched capacitors architecture exemplified in FIG. 5: a detailed description of the architecture will therefore not be repeated herein. Substantially, the two instances of the switched capacitors architecture are operated alternatively so that while one pair of switched capacitors provides the threshold voltage $V_{th}$ for comparator 52, the other pair of switched capacitors is ready to store a refreshed value of the threshold voltage, and vice versa.

In brief, the threshold voltage generator circuit no includes a first capacitor C1, a second capacitor C2, a first switch S1, a second switch S2 and a third switch S3 arranged and controlled substantially as disclosed with reference to FIG. 5. Additionally, the threshold voltage generator circuit no includes a third capacitor C3, a fourth capacitor C4, a fourth switch S4, a fifth switch S5 and a sixth switch S6 arranged again substantially like capacitors C1 and C2 and switches S1, S2 and S3 of FIG. 5. Capacitors C3 and C4 may have the same capacitance value, which may be equal to the capacitance value of capacitors C1 and C2. Switch S4 is controlled by a control signal Φ2, e.g., it is closed when signal Φ2 is asserted and open when signal Φ2 is de-asserted. Switch S5 is controlled by a control signal Φ2 that is the complement of signal Φ2, e.g., it is closed when signal Φ2 is asserted and open when signal Φ2 is de-asserted. Switch S6 is controlled by control signal Φ2, e.g., it is closed when signal Φ2 is asserted and open when signal Φ2 is de-asserted.

As exemplified in FIG. 8, comparator 52 has a first (e.g., inverting) input connected to the output terminal of amplifier 50 to receive signal $V_{amp}$, and a second (e.g., non-inverting) input alternatively connectable to the first terminal of capacitor C2 or to the first terminal of capacitor C4 via respective switches S7 and S8 to receive the threshold voltage $V_{th}$ produced at those nodes. Switch S7 is controlled by control signal Φ1, e.g., it is closed when signal Φ1 is asserted and open when signal Φ1 is de-asserted. Therefore, switch S7 is configured to couple the second input of comparator 52 to the first terminal of capacitor C2 when signal Φ1 is asserted and decouple the second input of comparator 52 from the first terminal of capacitor C2 when signal Φ1 is de-asserted. Switch S8 is controlled by control signal Φ1, e.g., it is closed when signal Φ1 is asserted and open when signal Φ1 is de-asserted. Therefore, switch S8 is configured to couple the second input of comparator 52 to the first terminal of capacitor C4 when signal Φ1 is asserted and decouple the second input of comparator 52 from the first terminal of capacitor C4 when signal Φ1 is de-asserted.

Additionally, the threshold voltage generator circuit no includes control circuitry configured to generate the control signals Φ1 and Φ2 (and their complements Φ1 and Φ2) for producing and refreshing the threshold voltage $V_{th}$ for comparator 52. The control circuitry may include a finite state machine (FSM) circuit 112 configured to receive a respective clock signal CK produced at the output of an AND logic gate 114 that applies AND processing to signals Din and Clk. Generally, clock signal CK is a replica of clock signal Clk while the received bit is a '1' (i.e., while Din='1'), and is tied to '0' while the received bit is a '0' (i.e., while Din='0').

Figure 9:
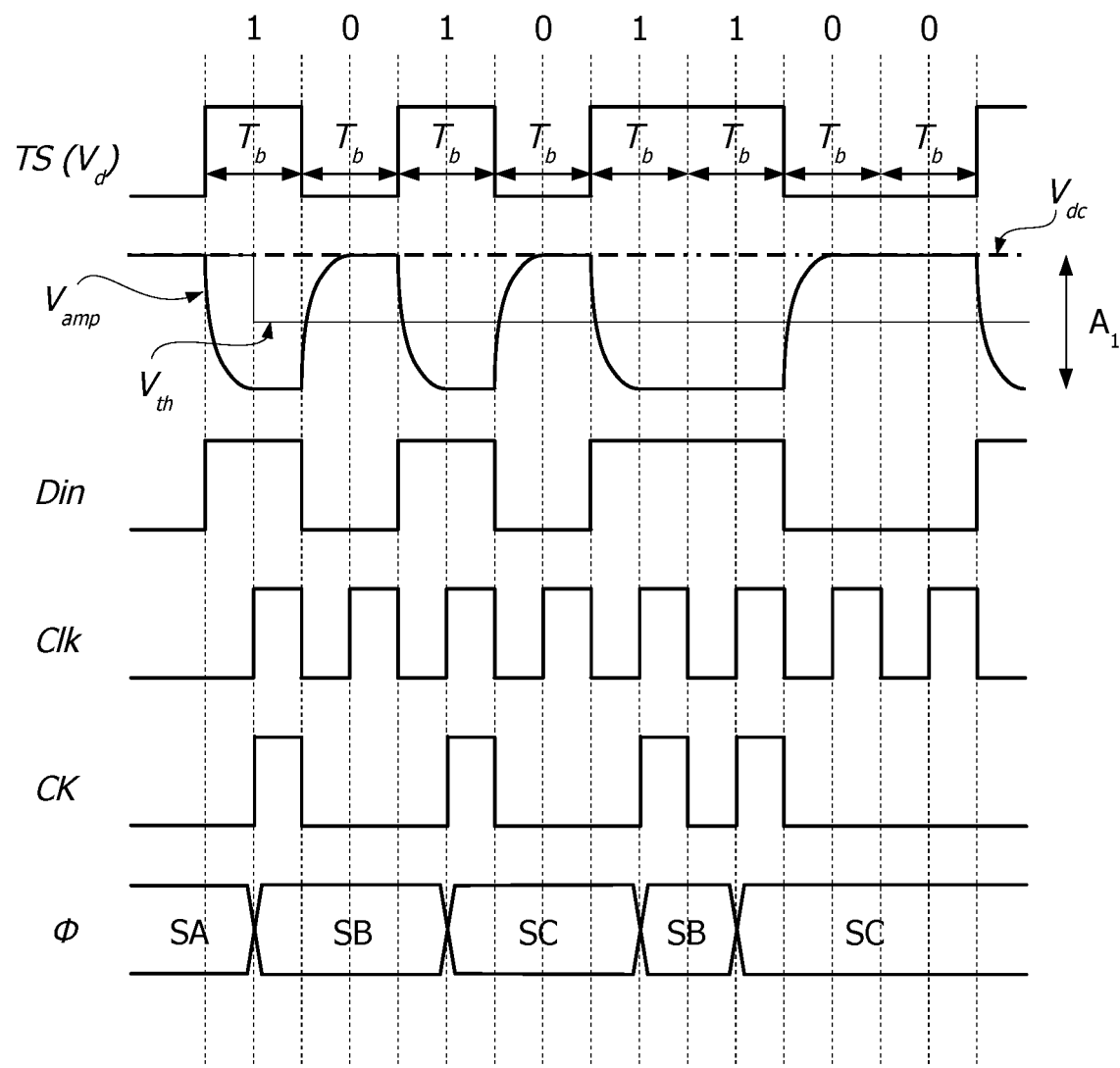
FIG. 9 is a time diagram exemplary of possible time evolution of signals in the receiver device of FIG. 8.
Figure 10:
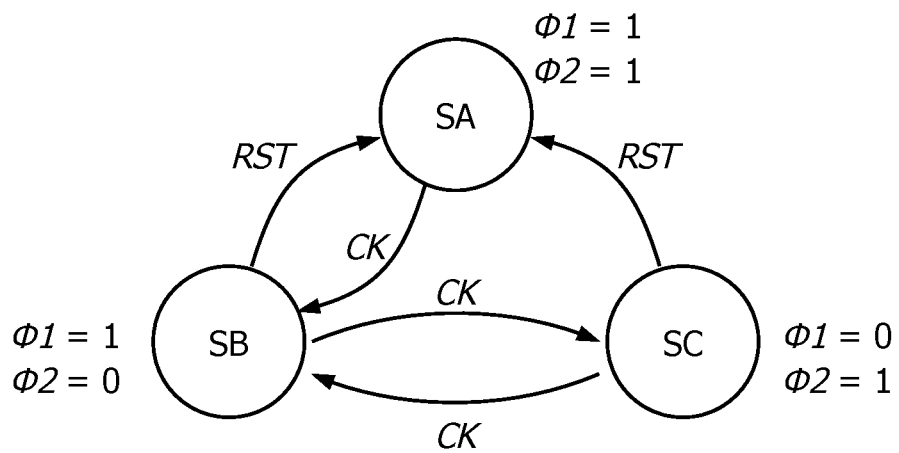
FIG. 10 is a block diagram exemplary of operation states of a finite state machine of the receiver device of FIG. 8.

Operation of receiver device 9 and threshold voltage generator circuit no may be further understood with reference to FIG. 9, which is a time diagram exemplary of possible time evolution of signals in the receiver device 9 of FIG. 8, and FIG. 10, which is a state diagram exemplary of possible operation states and transitions of the finite state machine 112. As exemplified in FIGS. 8, 9 and 10, the finite state machine 112 may switch between a first state SA, a second state SB and a third state SC.

In particular, the first state SA is a reset state, and the FSM 112 initially operates in state SA, i.e., until detecting a first edge in the respective clock signal CK. In the reset state SA, one pair of switched capacitors (e.g., pair C3 and C4) are configured as in the initial condition described with reference to the embodiment of FIGS. 5 and 6, that is, a first capacitor of the pair (e.g., C3) is coupled to the output of amplifier 50 and is charged to voltage $V_{amp}$, while a second capacitor of the pair (e.g., C4) is coupled to the bias source 92 and is charged to voltage $V_{dc}$, the two capacitors of the pair being decoupled from each other, and the second capacitor being coupled to the second input of comparator 52. This condition enables comparator 52 to detect the first transition of signal $V_{amp}$. In the reset state, the other pair of switched capacitors (e.g., pair C1 and C2) are decoupled from the input of comparator 52 (e.g., by switch S7 being open). It is preferable to have also switch S2 open, in order to prevent the amplifier 50 from being loaded also by capacitor C2. In brief, the values of the control signals when the FSM 112 is in the reset state SA can be summarized as follows, where a '1' symbol means "signal asserted", and a '0' symbol means "signal de-asserted": Φ1=1 and Φ2=1.

In response to detecting an edge in the clock signal CK (e.g., during the first received bit '1' of the data packet), the FSM 112 switches from state SA to state SB. In state SB, the pair of capacitors that were charged to voltage $V_{amp}$ and voltage $V_{dc}$ during state SA (e.g., pair C3 and C4) are decoupled from amplifier 50 and bias source 92, respectively, and are coupled in parallel so that charge redistribution takes place between them.

Having the two capacitors the same capacitance value, the voltage $V_{th}$ across them when coupled in parallel is equal to the average between the maximum and minimum values of $V_{amp}$ (e.g., $V_{th}=V_{dc}-(A_1/2)$). In state SB, voltage $V_{th}$ produced across the two parallel-connected capacitors is fed to the second input of comparator 52, e.g., via switch S8 being closed. At the same time, in state SB, the other pair of capacitors that were initially disconnected from comparator 52 (e.g., pair C1 and C2) is arranged so that a first capacitor of the pair (e.g., C1) is coupled to the output of amplifier 50 and is charged to voltage $V_{amp}$, while a second capacitor of the pair (e.g., C2) is coupled to the bias source 92 and is charged to voltage $V_{dc}$, the two capacitors of the pair being decoupled from each other, and being also decoupled from the comparator 52, e.g., with switches S1 and S3 closed and switches S2 and S7 open. By doing so, while one pair of capacitors (e.g., C3 and C4) provides the threshold voltage $V_{th}$ to comparator 52, the other pair of capacitors (e.g., C1 and C2) get charged so as to be able to provide a refreshed threshold voltage $V_{th}$ once subsequently connected in parallel. In brief, the values of the control signals when the FSM 112 is in the state SB can be summarized as follows: $\Phi1=1$ and $\Phi2=0$.

In response to detecting a subsequent edge in the clock signal CK (e.g., during another received bit '1' of the data packet), the FSM 112 switches from state SB to state SC. State SC is substantially complementary to state SB. In state SC, the pair of capacitors that were charged to voltage $V_{amp}$ and voltage $V_{dc}$ during state SB (e.g., C1 and C2) are decoupled from amplifier 50 and bias source 92, respectively, and are coupled in parallel so that charge redistribution takes place between them.

Having the two capacitors the same capacitance value, the voltage $V_{th}$ across them when coupled in parallel is equal to the average between the maximum and minimum values of $V_{amp}$ (e.g., $V_{th}=V_{dc}-(A_1/2)$). In state SC, voltage $V_{th}$ produced across the two parallel-connected capacitors is fed to the second input of comparator 52, e.g., via switch S7 being closed. At the same time, in state SC, the other pair of capacitors that were parallel-connected during state SB (e.g., C3 and C4) is arranged so that a first capacitor of the pair (e.g., C3) is coupled to the output of amplifier 50 and is charged to voltage $V_{amp}$, while a second capacitor of the pair (e.g., C4) is coupled to the bias source 92 and is charged to voltage $V_{dc}$, the two capacitors of the pair being decoupled from each other, and being also decoupled from the comparator 52, e.g., with switches S4 and S6 closed and switches S5 and S8 open. By doing so, while one pair of capacitors (e.g., C1 and C2) provides the threshold voltage $V_{th}$ to comparator 52, the other pair of capacitors (e.g., C3 and C4) get charged so as to be able to provide a refreshed threshold voltage $V_{th}$ once subsequently connected in parallel. In brief, the values of the control signals when the FSM 112 is in the state SC can be summarized as follows: $\Phi1=0$ and $\Phi2=1$.

Purely by way of example, one or more embodiments as exemplified in FIG. 8 may provide the following performance in a 90-nm CMOS technology from STMicroelectronics: at a supply voltage of 0.6 V and a data bit rate of 1 kbit/s, power consumption of the receiver device may be in the order of 13.5 nW and, using capacitances C1, C2, C3 and C4 equal to 1 pF, the maximum receivable packet length may be virtually unlimited. The maximum number of receivable consecutive zeros may be about 140 bits, and the maximum number of receivable consecutive ones may be virtually unlimited, since refresh of the threshold voltage takes place when a '1' bit is received.

It is noted that the maximum number of receivable consecutive zeros may be increased and made virtually unlimited by forcing the transmitted data signal TS to include some bits having '1' value even when transmitting a sequence of '0', as may be the case, for instance, by applying Manchester encoding. Alternatively, if amplifier 50 were a non-inverting amplifier, the maximum number of receivable consecutive zeros would be virtually unlimited, since refresh of the threshold voltage would take place when a '0' bit is received.

Optionally, in one or more embodiments as exemplified in FIG. 8, a frequency divider circuit 116 may be arranged in the signal path between the oscillator 56 and the AND logic gate 114 to propagate only a subset of pulses of signal Clk, so that the clock signal CK for the FSM circuit 112 includes fewer pulses (i.e., it does not include a pulse at each '1' that appears in the received data packet) and refresh of the threshold voltage $V_{th}$ happens less frequently. A lower refresh rate may advantageously result in a lower power consumption.

Therefore, one or more embodiments as exemplified in FIG. 8 may provide, in addition to the advantages previously discussed in connection with embodiments as exemplified in FIG. 5, a further advantage in that the value of the threshold voltage $V_{th}$ may be updated and/or adjusted during reception of a data packet (or data stream) to adapt to possible variations of the amplitude of the received signal $V_{amp}$ and/or to refresh the threshold voltage value to counter leakage effects.

It is noted that, despite the threshold voltage refresh capability of embodiments as exemplified in FIG. 8, the configuration principle disclosed with reference to FIG. 7 could be applied to these embodiments as well.

Figure 11:
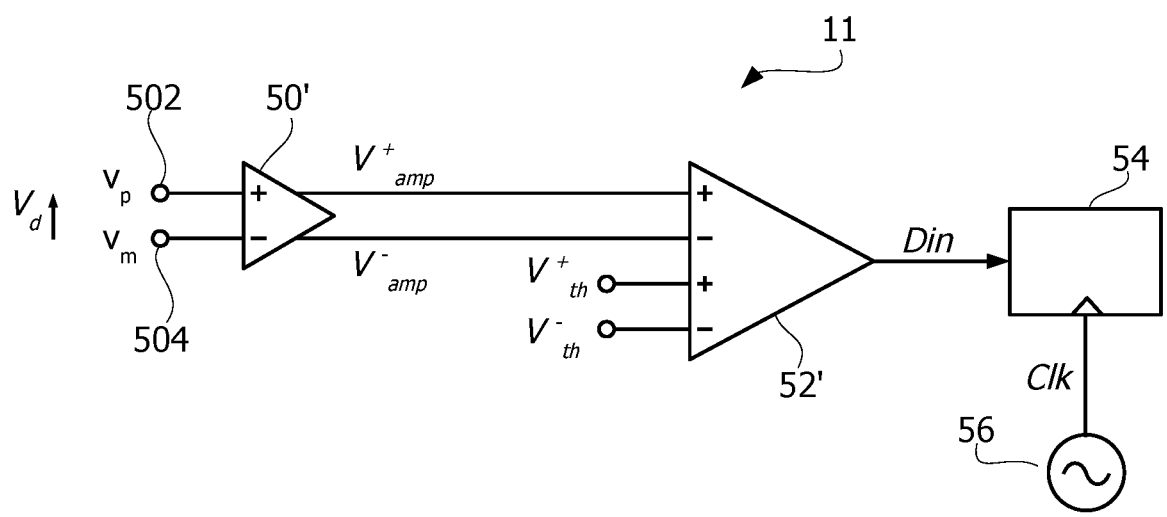
FIG. 11 is a circuit block diagram exemplary of a differential receiver device for use in a communication system, the differential receiver device including a digital circuit clocked by an oscillator circuit and related differential analog-to-digital conversion circuitry.

Receiver devices 11 as exemplified in FIG. 11, which rely on a fully differential architecture, are also within the possible applications of embodiments. A receiver device 11 operates substantially like receiver device 5 exemplified in FIG. 1, but includes a fully differential amplifier circuit 50' with gain G1 that produces a first (e.g., positive) amplified output signal $V^+_{amp}$ and a second (e.g., negative) amplified output signal $V^-_{amp}$, so that $V_{amp,diff}=V^+_{amp}-V^-_{amp}=G1 \cdot (v_p-v_m)$ The receiver device 11 also includes a differential comparator circuit 52' with gain G2 that receives the signals $V^+_{amp}$ and $V^-_{amp}$ produced by amplifier 50' as well as a first (e.g., positive) threshold voltage $V^+_{th}$ and a second (e.g., negative) threshold voltage $V^-_{th}$ to produce the digital data signal Din according to the equations below (where G2 indicates the gain of amplifier 52' and $V_{th,diff}=V^+_{th}-V^-_{th}$):

$$Din = \begin{cases} 1, & G2 \cdot (V_{amp,diff} - V_{th,diff}) \geq 0 \\ 0, & G2 \cdot (V_{amp,diff} - V_{th,diff}) < 0 \end{cases}$$

The paper to Wong (Wong, K. L. J.; Le, M.; Kim, K. Y.: "A 20 µV/° C. digital offset compensation technique for comparators and differential amplifiers," 2012 IEEE Asian Solid State Circuits Conference (A-SSCC), 2012, pp. 53-56, doi: 10.1109/IPEC.2012.6522625) is exemplary of a possible transistor-level implementation of differential comparator circuit 52'.

Therefore, one or more embodiments may be configured to generate not one threshold voltage $V_{th}$ but a pair of threshold voltages $V^+_{th}$ and $V^-_{th}$ as a function of the amplifier output signals $V^+_{amp}$ and $V^-_{amp}$.

Figure 12:
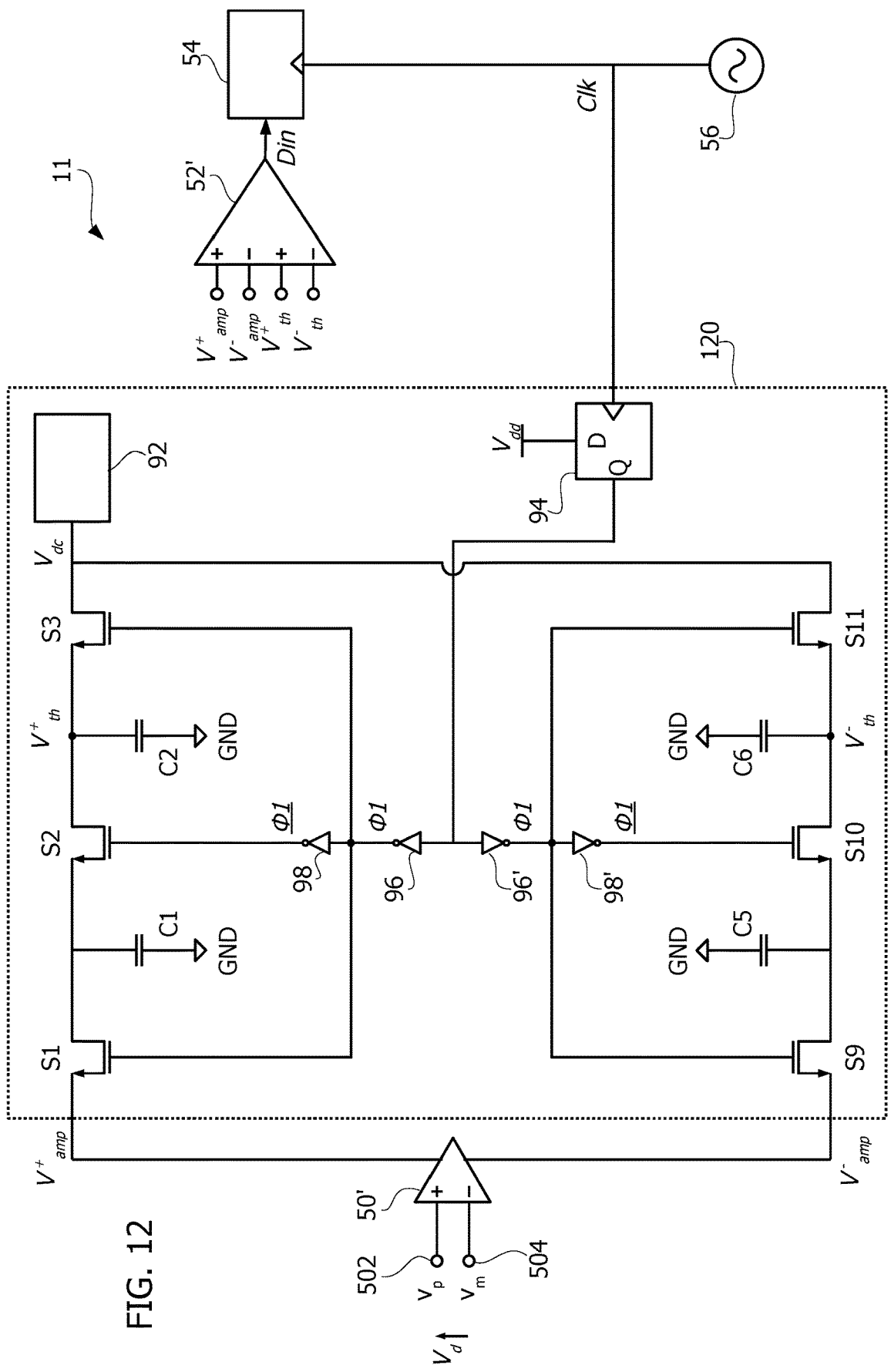
FIG. 12 is a circuit block diagram exemplary of a differential receiver device for use in a communication system, the differential receiver device including a differential threshold voltage generator circuit according to one or more embodiments of the present description.

FIG. 12 is a circuit block diagram exemplary of components of a receiver device 11 including analog-to-digital conversion circuitry that includes a comparator threshold voltage generator circuit 120 configured to generate such threshold voltages $V^+_{th}$ and $V^-_{th}$ as a function of the amplifier output voltage signals $V^+_{amp}$ and $V^-_{amp}$ by resorting to a sample-and-hold architecture. The architecture of FIG. 12 substantially includes two instances of the switched capacitors architecture exemplified in FIG. 5: a detailed description of the architecture will therefore not be repeated herein. The two instances of the switched capacitors architecture are operated synchronously: the first circuit is configured to receive the first amplifier output signal $V^+_{amp}$ and generate the first threshold voltage $V^+_{th}$ as a function thereof, and the second circuit is configured to receive the second amplifier output signal $V^-_{amp}$ and generate the second threshold voltage $V^-_{th}$ as a function thereof.

In brief, the threshold voltage generator circuit 120 includes a first capacitor C1, a second capacitor C2, a first switch S1, a second switch S2 and a third switch S3 arranged and controlled substantially as disclosed with reference to FIG. 5. Here in particular switch S1 has a first terminal connected to the first (e.g., positive) output terminal of amplifier 50' to receive signal $V^+_{amp}$, so that the first threshold voltage $V^+_{th}$ is produced at the first terminal of capacitor C2. Additionally, the threshold voltage generator circuit 120 includes a third capacitor C5, a fourth capacitor C6, a fourth switch S9, a fifth switch S10 and a sixth switch S11 arranged and controlled substantially like capacitors C1 and C2 and switches S1, S2 and S3. Here in particular switch S9 has a first terminal connected to the second (e.g., negative) output terminal of amplifier 50' to receive signal $V^-_{amp}$, so that the second threshold voltage $V^-_{th}$ is produced at the first terminal of capacitor C6. Capacitors C5 and C6 may have the same capacitance value, which may be equal to the capacitance value of capacitors C1 and C2.

Figure 13:
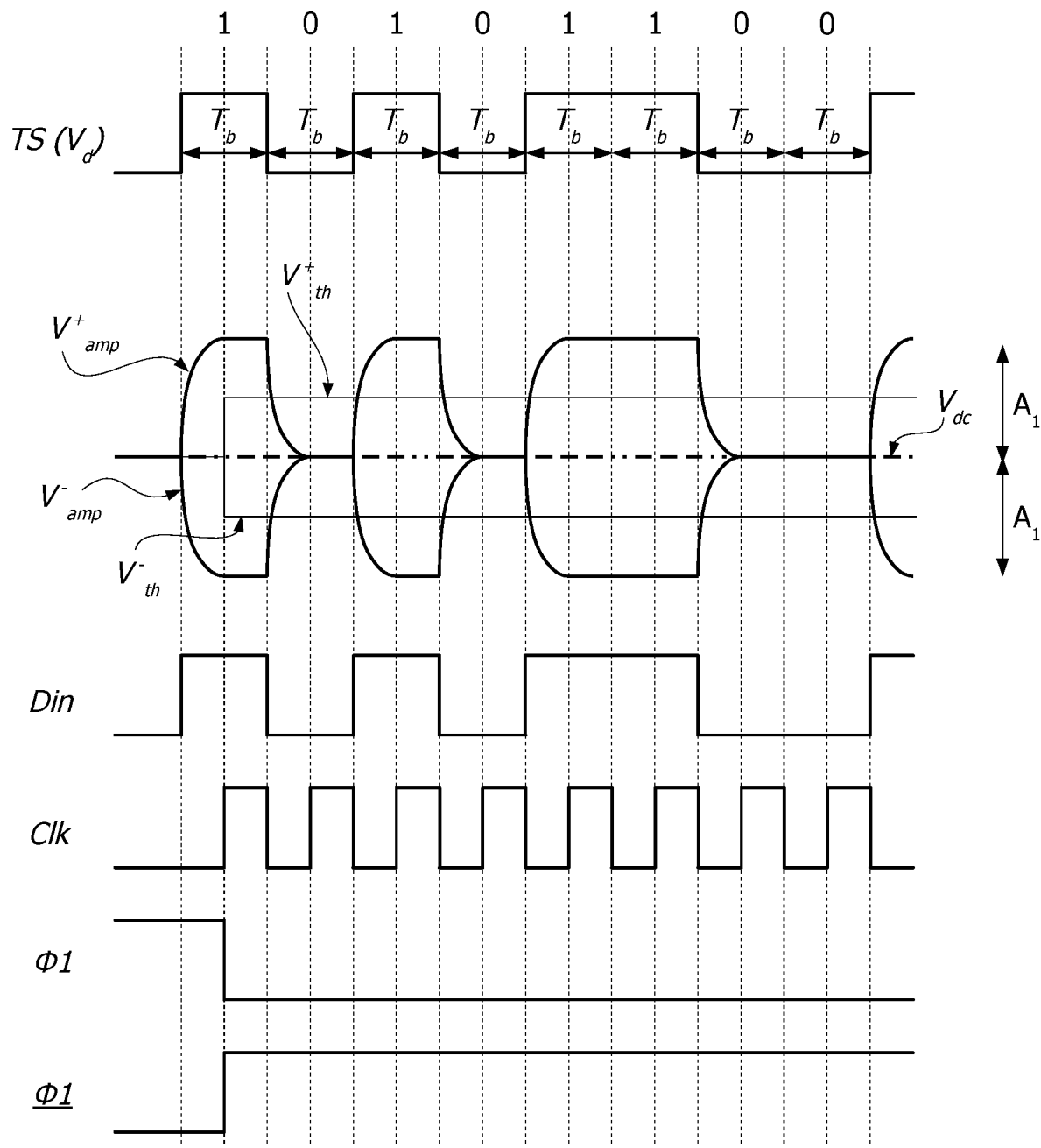
FIG. 13 is a time diagram exemplary of possible time evolution of signals in the differential receiver device of FIG. 12.

Operation of receiver device 11 and threshold voltage generator circuit 120 may be further understood with reference to FIG. 13, which is a time diagram exemplary of possible time evolution of signals in the receiver device 11 of FIG. 12. Here it is noted that the first threshold signal $V^+_{th}$ is produced as the average value between the minimum and maximum values of the first amplifier output signal $V^+_{amp}$ during the first received bit of the sequence, and the second threshold signal $V^-_{th}$ is produced as the average value between the minimum and maximum values of the second amplifier output signal $V^-_{amp}$ during the first received bit of the sequence.

It is noted that the configuration principle disclosed with reference to FIG. 7 could be applied to the embodiments exemplified in FIG. 12 as well.

Figure 14:
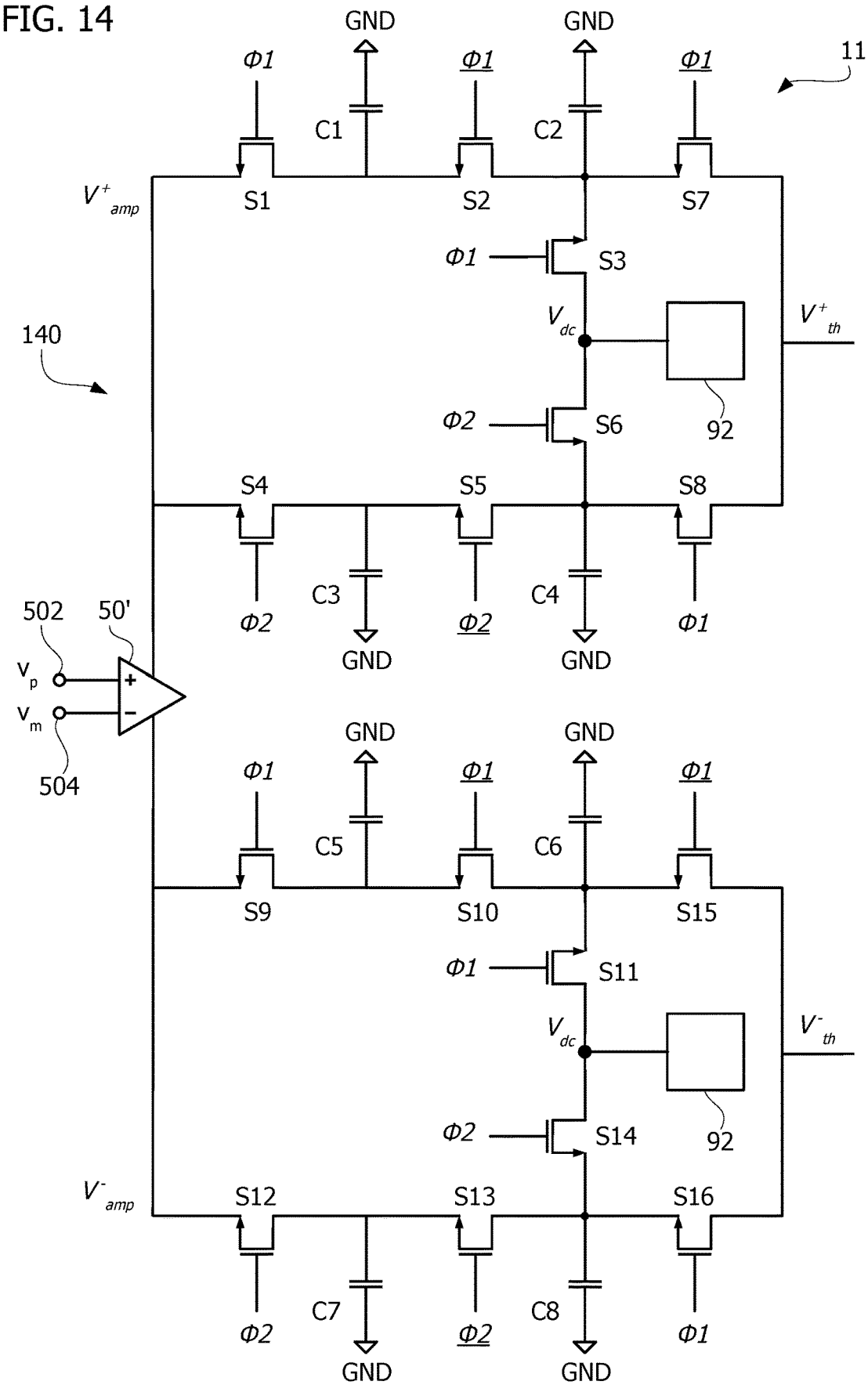
FIG. 14 is a circuit block diagram exemplary of a differential receiver device for use in a communication system, the differential receiver device including a differential threshold voltage generator circuit with refresh capability according to one or more embodiments of the present description.

In further embodiments, the threshold voltage refresh architecture exemplified in FIG. 8 may also be applied to receiver devices including a fully differential architecture as exemplified in FIG. 11 by substantially duplicating the architecture of FIG. 8, as exemplified in FIG. 14. FIG. 14 is a circuit block diagram exemplary of a threshold voltage generator circuit 140 configured to generate threshold voltages $V^+_{th}$ and $V^-_{th}$ as a function of the amplifier output voltage signals $V^+_{amp}$ and $V^-_{amp}$ by resorting to a sample-and-hold architecture with voltage refresh capabilities. The architecture of FIG. 14 substantially includes two instances of the same switched capacitors architecture exemplified in FIG. 8: a detailed description of the architecture will therefore not be repeated herein. The two instances of the switched capacitors architecture are operated synchronously: the first circuit is configured to receive the first amplifier output signal $V^+_{amp}$ and generate the first threshold voltage $V^+_{th}$ as a function thereof, and the second circuit is configured to receive the second amplifier output signal $V^-_{amp}$ and generate the second threshold voltage $V^-_{th}$ as a function thereof.

In brief, the threshold voltage generator circuit 140 includes a first capacitor C1, a second capacitor C2, a third capacitor C3, a fourth capacitor C4, a first switch S1 (controlled by signal Φ1), a second switch S2 (controlled by signal Φ1), a third switch S3 (controlled by signal Φ1), a fourth switch S4 (controlled by signal Φ2), a fifth switch S5 (controlled by signal Φ2), a sixth switch S6 (controlled by signal Φ2), a seventh switch S7 (controlled by signal Φ1) and an eighth switch S8 (controlled by signal Φ1) arranged and controlled substantially as discussed with reference to FIG. 8. Here in particular switches S1 and S4 have their first terminals connected to the first (e.g., positive) output terminal of amplifier 50' to receive signal $V^+_{amp}$, and the first terminals of capacitors C2 and C4 are alternatively connectable to the positive threshold input terminal of differential comparator 52' to provide the positive threshold voltage $V^+_{th}$ thereto.

Additionally, the threshold voltage generator circuit 140 includes a fifth capacitor C5, a sixth capacitor C6, a seventh capacitor C7, an eighth capacitor C8, a ninth switch S9 (controlled by signal Φ1), a tenth switch S10 (controlled by signal Φ1), an eleventh switch S11 (controlled by signal Φ1), a twelfth switch S12 (controlled by signal Φ2), a thirteenth switch S13 (controlled by signal Φ2), a fourteenth switch S14 (controlled by signal Φ2), a fifteenth switch S15 (controlled by signal Φ1) and a sixteenth switch S16 (controlled by signal Φ1) arranged substantially like capacitors C1, C2, C3, C4 and switches S1, S2, S3, S4, S5, S6, S7 and S8 of FIG. 8. Here in particular switches S9 and S12 have their first terminals connected to the second (e.g., negative) output terminal of amplifier 50' to receive signal $V^-_{amp}$, and the first terminals of capacitors C6 and C8 are alternatively connectable to the negative threshold input terminal of differential comparator 52' to provide the negative threshold voltage $V^-_{th}$ thereto. Capacitors C5, C6, C7, and C8 may have the same capacitance value, which may be equal to the capacitance value of capacitors C1, C2, C3, and C4.

The control circuitry configured to generate the control signals Φ1 and Φ2 (and their complements Φ1 and Φ2) for producing and refreshing the threshold voltages $V^+_{th}$ and $V^-_{th}$ for comparator 52', not visible in FIG. 14, may be the same as exemplified in FIG. 8 (e.g., including a finite state machine circuit 112, an AND logic gate 114 and optionally a frequency divider 116). Operation of the finite state machine may be the same as discussed with reference to FIG. 10.

Figure 15:
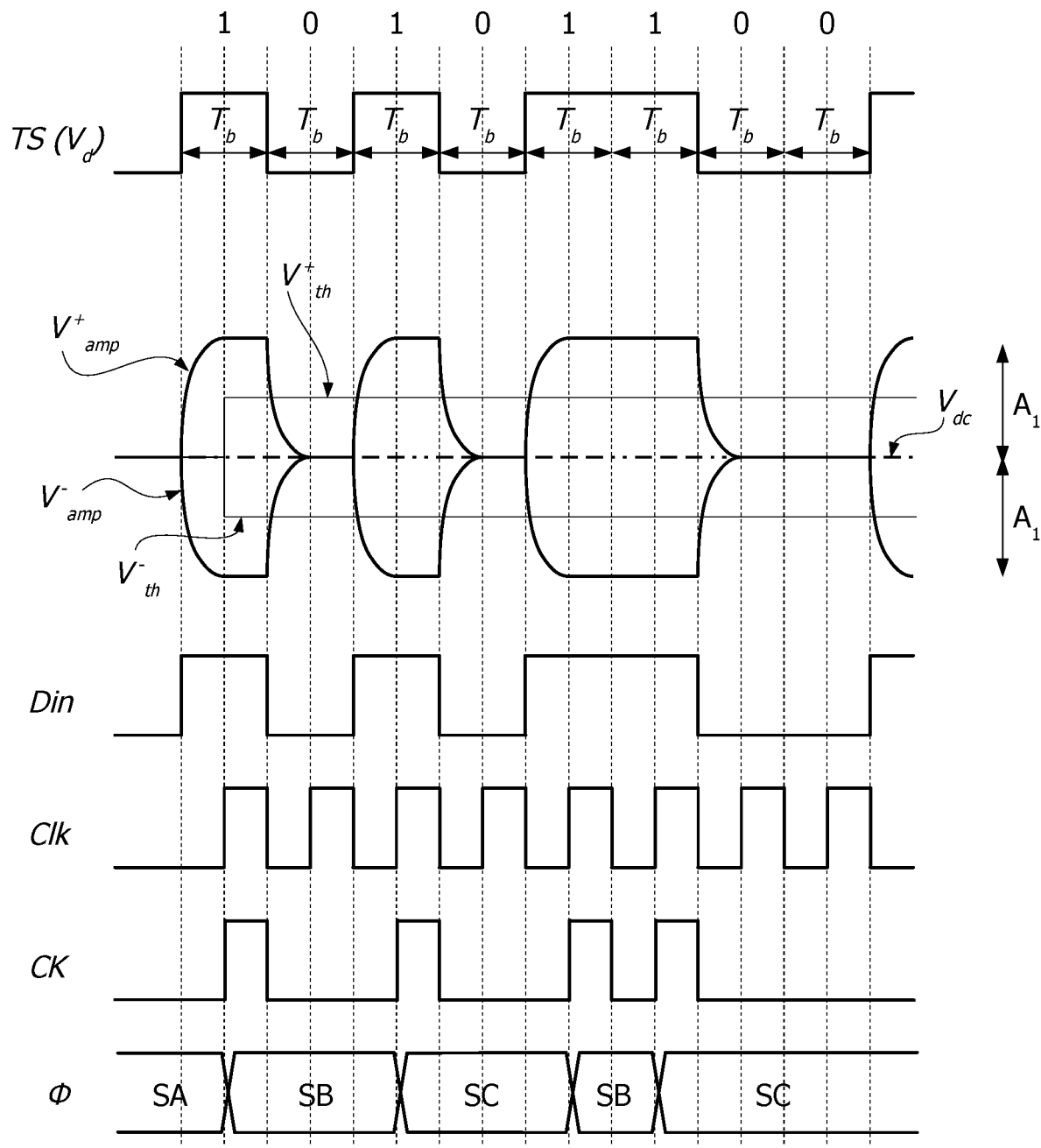
FIG. 15 is a time diagram exemplary of possible time evolution of signals in the differential receiver device of FIG. 14.

Operation of receiver device 11 and threshold voltage generator circuit 140 may be further understood with reference to FIG. 15, which is a time diagram exemplary of possible time evolution of signals in the receiver device 11 of FIG. 14.

It is noted that, despite the threshold voltage refresh capability of embodiments as exemplified in FIG. 14, the configuration principle disclosed with reference to FIG. 7 could be applied to these embodiments as well.

Figure 16:
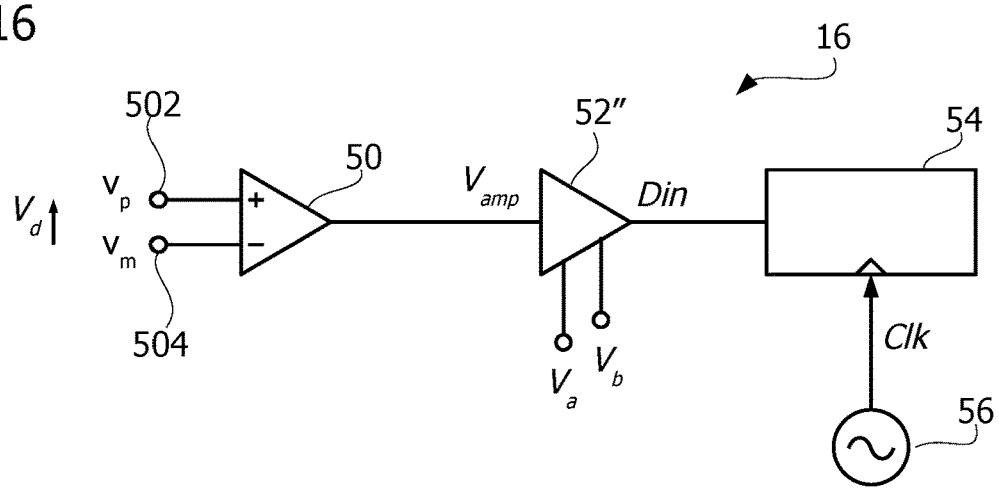
FIG. 16 is a circuit block diagram exemplary of another receiver device for use in a communication system, the receiver device including a digital circuit clocked by an oscillator circuit and related analog-to-digital conversion circuitry with hysteretic behavior.

Receiver devices 16 as exemplified in FIG. 16, which rely on a Schmitt trigger comparator instead of a simple (one-threshold) comparator, are also within the possible applications of embodiments. A receiver device 16 operates substantially like receiver device 5 exemplified in FIG. 1, but includes an (e.g., inverting) Schmitt trigger comparator 52" that receives the amplified signal $V_{amp}$ produced by amplifier 50 as well as a first (e.g., higher) threshold voltage $V_a$ and a second (e.g., lower) threshold voltage $V_b$ to produce the digital data signal Din by comparing with hysteresis signal $V_{amp}$ to signals $V_a$ and $V_b$; the non-zero difference between $V_a$ and $V_b$ (i.e., the hysteresis range of comparator 52") may be indicated herein as $V_{hys}=V_a-V_b$. Operation of Schmitt triggers is known in the art and will not be further discussed herein; in brief, assuming that the initial state is Din=0, signal Din switches from 0 to 1 if $V_{amp}<V_b$ and from 1 to 0 if $V_{amp}>V_a$. The values of the threshold voltages $V_a$ and $V_b$ may be selected so as to target a 50% duty-cycle for the digital signal Din but, more generally, they may be set according to the system specifications (e.g., noise performance or rejection to interferences and/or glitches). Of course, as mentioned previously, the architecture exemplified herein may also be applied to the case of a receiver including a non-inverting amplifier 50 (instead of the inverting one) and a non-inverting Schmitt trigger 52" instead of the inverting one.

Therefore, one or more embodiments may be configured to generate not one threshold voltage $V_{th}$ but a pair of threshold voltages $V_a$ and $V_b$ as a function of the amplifier output signal $V_{amp}$.

Figure 17:
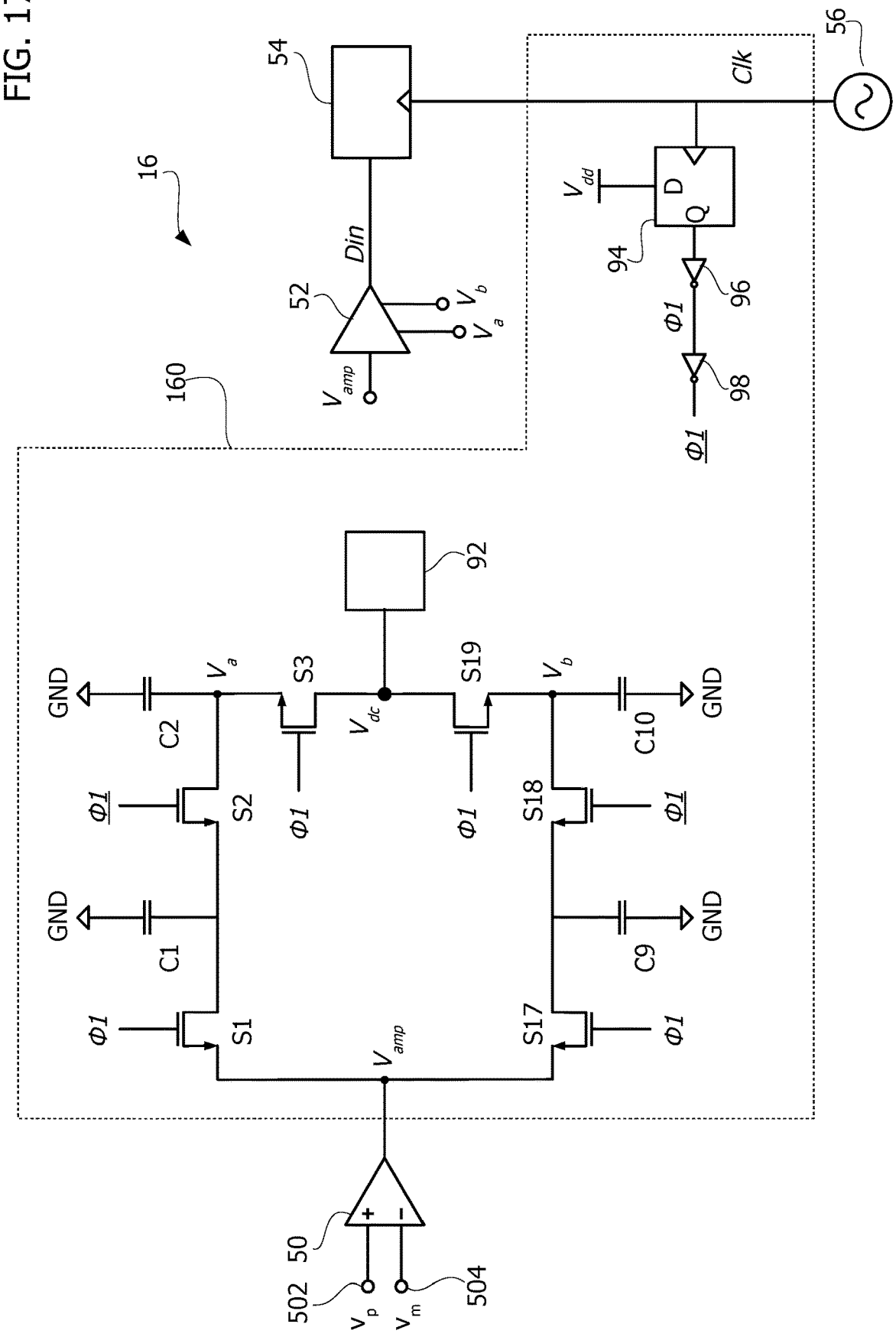
FIG. 17 is a circuit block diagram exemplary of a receiver device for use in a communication system, the receiver device including a threshold voltage generator circuit according to one or more embodiments of the present description.

FIG. 17 is a circuit block diagram exemplary of components of a receiver device 16 including analog-to-digital conversion circuitry that includes a comparator threshold voltage generator circuit 160 configured to generate such threshold voltages $V_a$ and $V_b$ as a function of the amplifier output voltage signal $V_{amp}$ by resorting to a sample-and-hold architecture. The architecture of FIG. 17 substantially includes two instances of the switched capacitors architecture exemplified in FIG. 5: a detailed description of the architecture will therefore not be repeated herein. The two instances of the switched capacitors architecture are operated synchronously: the first circuit is configured to receive the amplifier output signal $V_{amp}$ and generate the first threshold voltage $V_a$ as a function thereof, and the second circuit is configured to receive the amplifier output signal $V_{amp}$ and generate the second threshold voltage $V_b$ as a function thereof.

In brief, the threshold voltage generator circuit 160 includes a first capacitor C1, a second capacitor C2, a first switch S1, a second switch S2 and a third switch S3 arranged and controlled substantially as disclosed with reference to FIG. 5. The first threshold voltage $V_a$ is thus produced at the first terminal of capacitor C2. Additionally, the threshold voltage generator circuit 160 includes a third capacitor C9, a fourth capacitor C10, a fourth switch S17, a fifth switch S18 and a sixth switch S19 arranged and controlled substantially like capacitors C1 and C2 and switches S1, S2 and S3. The second threshold voltage $V_b$ is thus produced at the first terminal of capacitor C10. Differently from the previous embodiments, capacitors C1, C2, C9 and C10 may have different capacitance values, so that $V_a \neq V_b$.

In particular, the capacitance values of capacitors C1, C2, C9 and C10 may be defined as follows, where C generically indicates a same capacitance value (e.g., unit capacitance):

$$C1 = C$$
$$C2 = (N-1) \cdot C$$
$$C9 = C$$
$$C10 = \left(\frac{1}{M-1}\right) \cdot C$$

At the beginning of reception of a data packet, when $\Phi1=1$ and $\bar{\Phi}1=0$, the system operates in steady-state condition and $V_{amp}=V_{dc}$. The charge Q1, Q2, Q9 and Q10 stored respectively in capacitors C1, C2, C9 and C10 may be computed as:

$$Q1 = C \cdot V_{dc}$$
$$Q2 = (N-1) \cdot C \cdot V_{dc}$$
$$Q9 = C \cdot V_{dc}$$
$$Q10 = \left(\frac{1}{M-1}\right) \cdot C \cdot V_{dc}$$

When the system switches to $\Phi1=0$ and $\bar{\Phi}1=1$, the amplifier output voltage is equal to $V_{amp}=V_{de}-A_1$. The charge Q1, Q2, Q9 and Q10 may thus be computed as:

$$Q1 = C \cdot (V_{dc} - A_1)$$
$$Q2 = (N-1) \cdot C \cdot V_{dc}$$
$$Q9 = C \cdot (V_{dc} - A_1)$$
$$Q10 = \left(\frac{1}{M-1}\right) \cdot C \cdot V_{dc}$$

The resulting values of the threshold voltages $V_a$ and $V_b$ may thus be computed as:

$$V_a = \frac{(V_{dc} - A_1) + (N-1) \cdot V_{dc}}{N}$$
$$V_b = \frac{(M-1) \cdot (V_{dc} - A_1) + V_{dc}}{M}$$

The values of N and M may be designed to set the threshold voltages $V_a$ and $V_b$ for the Schmitt Trigger 52" according to the system specifications. In order to have $V_a$ higher than $V_b$, the relation $N \leq M$ may be enforced. In case a 50% duty-cycle for signal Din is targeted, voltages $V_a$ and $V_b$ may be placed symmetrically with respect to the average value of the amplifier output voltage $V_{amp}$ (i.e., symmetrically with respect to $V_{dc}-(A_1/2)$—in other words, the average value of $V_a$ and $V_b$ is the same as the average value of signal $V_{amp}$), a condition that may be obtained by imposing N=M. In case the system has no particular design constraints on the duty-cycle of signal Din, it is possible to choose a value of N different from that of M. For instance, if $V_{dc}$=200 mV, $A_1$=10 mV and N=M=4, the resulting threshold values are $V_a$=197.5 mV and $V_b$=192.5 mV. In another example, if $V_{dc}$=200 mV, $A_1$=10 mV, N=5 and M=10, the resulting threshold values are $V_a$=198 mV and $V_b$=191 mV.

Figure 18:
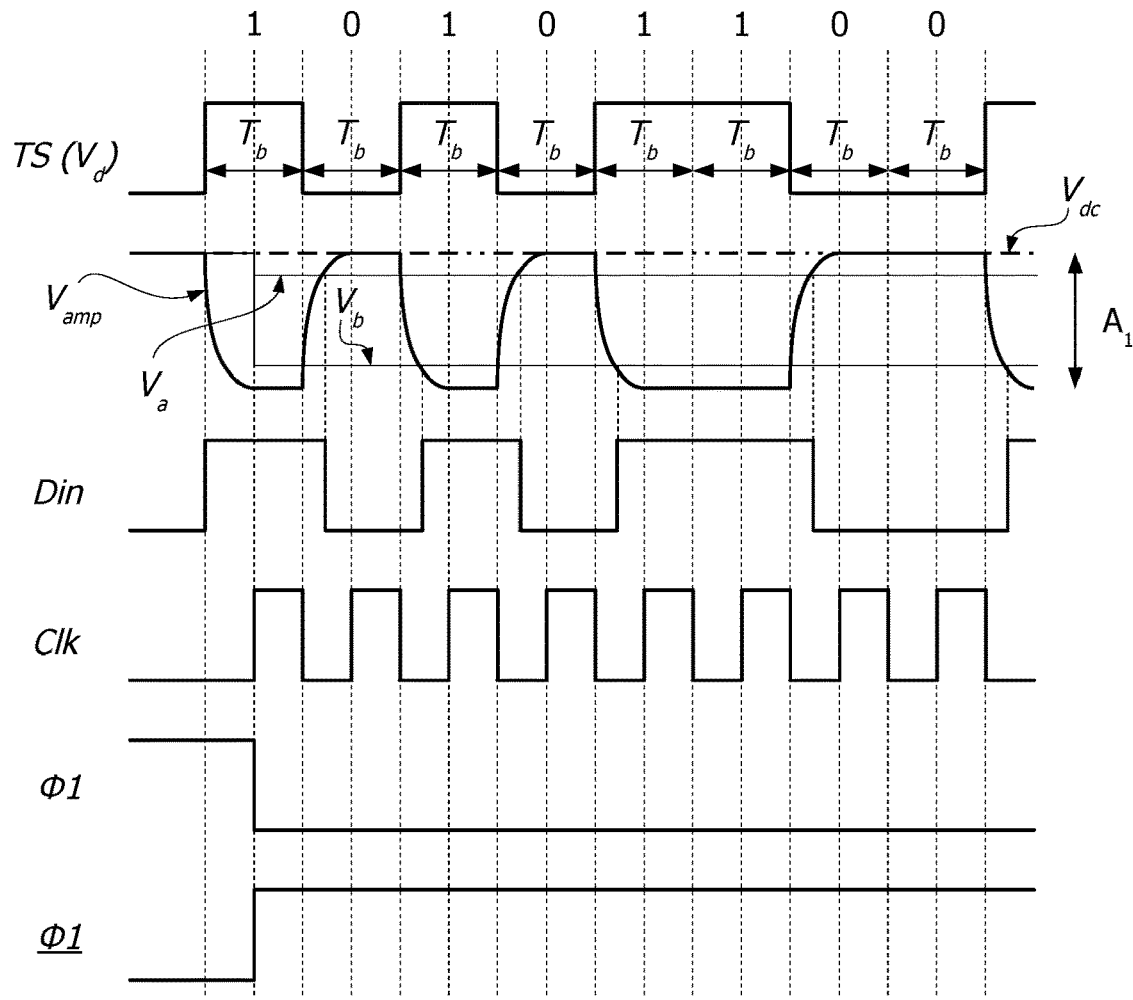
FIG. 18 is a time diagram exemplary of possible time evolution of signals in the hysteretic receiver device of FIG. 17.

Operation of receiver device 16 and threshold voltage generator circuit 160 may be further understood with reference to FIG. 18, which is a time diagram exemplary of possible time evolution of signals in the receiver device 16 of FIG. 17. Here it is noted that the first threshold signal $V_a$ and the second threshold signal $V_b$ are produced as symmetric with respect to the average value of the amplifier output voltage $V_{amp}$.

It is noted that the configuration principle disclosed with reference to FIG. 7 could be applied to the embodiments exemplified in FIG. 17 as well.

Figure 19:
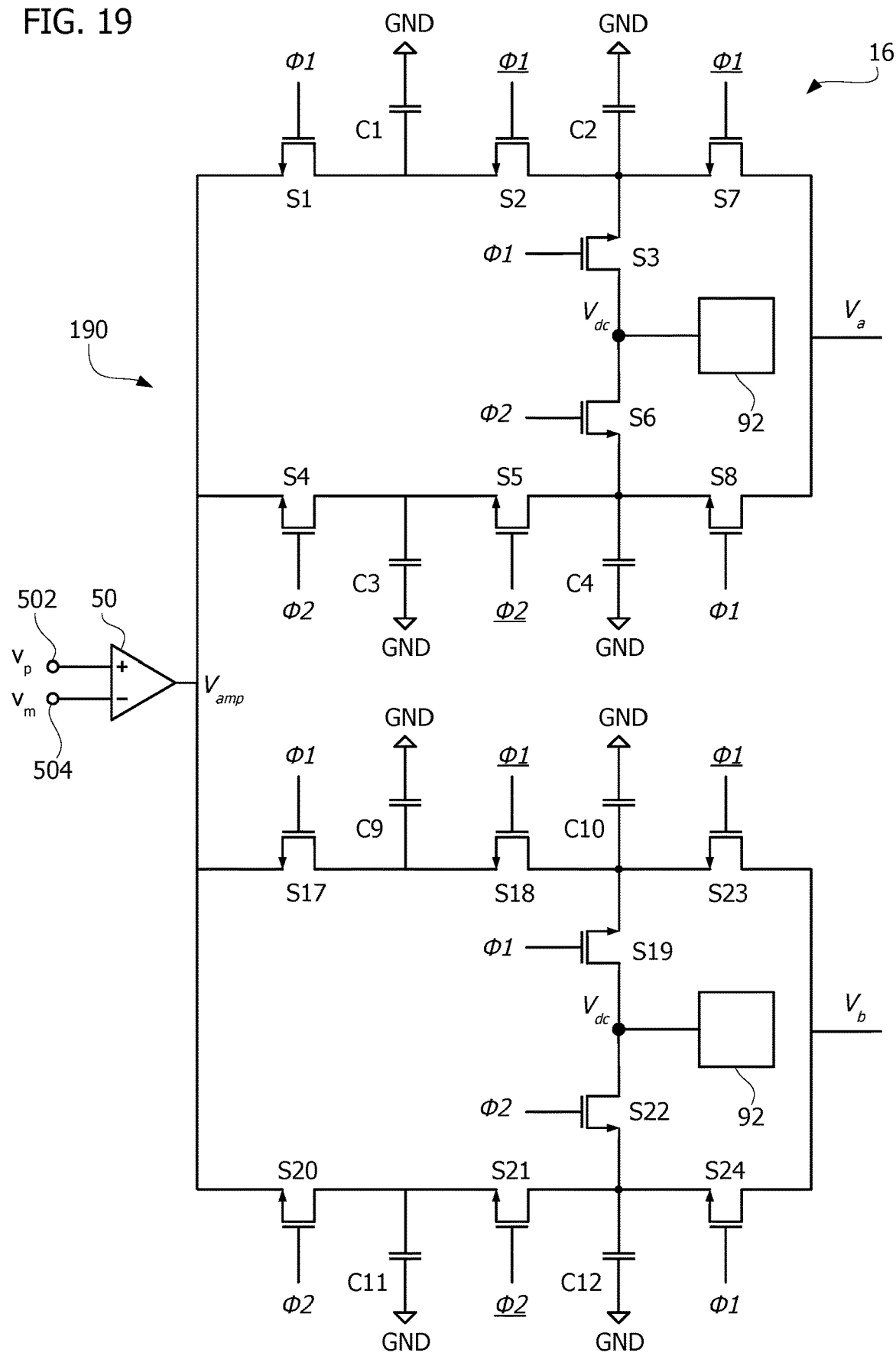
FIG. 19 is a circuit block diagram exemplary of a hysteretic receiver device for use in a communication system, the hysteretic receiver device including a threshold voltage generator circuit with refresh capability according to one or more embodiments of the present description.

In further embodiments, the threshold voltage refresh architecture exemplified in FIG. 8 may also be applied to receiver devices including a Schmitt trigger comparator 52" as exemplified in FIG. 16 by substantially duplicating the architecture of FIG. 8, as exemplified in FIG. 19. FIG. 19 is a circuit block diagram exemplary of a threshold voltage generator circuit 190 configured to generate threshold voltages $V_a$ and $V_b$ as a function of the amplifier output voltage signal $V_{amp}$ by resorting to a sample-and-hold architecture with voltage refresh capabilities. The architecture of FIG. 19 substantially includes two instances of the same switched capacitors architecture exemplified in FIG. 8: a detailed description of the architecture will therefore not be repeated herein. The two instances of the switched capacitors architecture are operated synchronously: the first circuit is configured to receive the amplifier output signal $V_{amp}$ and generate the first threshold voltage $V_a$ as a function thereof, and the second circuit is configured to receive the amplifier output signal $V_{amp}$ and generate the second threshold voltage $V_b$ as a function thereof.

In brief, the threshold voltage generator circuit 190 includes a first capacitor C1, a second capacitor C2, a third capacitor C3, a fourth capacitor C4, a first switch S1 (controlled by signal Φ1), a second switch S2 (controlled by signal Φ1), a third switch S3 (controlled by signal Φ1), a fourth switch S4 (controlled by signal Φ2), a fifth switch S5 (controlled by signal Φ2), a sixth switch S6 (controlled by signal Φ2), a seventh switch S7 (controlled by signal Φ1) and an eighth switch S8 (controlled by signal Φ1) arranged and controlled substantially as discussed with reference to FIG. 8. Here in particular the first terminals of capacitors C2 and C4 are alternatively connectable to the first threshold input terminal of Schmitt trigger comparator 52" to provide the first threshold voltage $V_a$ thereto.

Additionally, the threshold voltage generator circuit 190 includes a fifth capacitor C9, a sixth capacitor C10, a seventh capacitor C11, an eighth capacitor C12, a ninth switch S17 (controlled by signal Φ1), a tenth switch S18 (controlled by signal Φ1), an eleventh switch S19 (controlled by signal Φ1), a twelfth switch S20 (controlled by signal Φ2), a thirteenth switch S21 (controlled by signal Φ2), a fourteenth switch S22 (controlled by signal Φ2), a fifteenth switch S23 (controlled by signal Φ1) and a sixteenth switch S24 (controlled by signal Φ1) arranged substantially like capacitors C1, C2, C3, C4 and switches S1, S2, S3, S4, S5, S6, S7 and S8 of FIG. 8. Here in particular the first terminals of capacitors C10 and C12 are alternatively connectable to the second threshold input terminal of Schmitt trigger comparator 52" to provide the second threshold voltage $V_b$ thereto. Differently from other embodiments presented previously, capacitors C1, C2, C3, C4, C9, C10, C11 and C12 may have different capacitance values, so that $V_a \neq V_b$.

In particular, the capacitance values of capacitors C1, C2, C3, C4, C9, Cm, C11 and C12 may be defined as follows, where C generically indicates a same capacitance value (e.g., unit capacitance):

$$C1 = C3 = C9 = C11 = C$$

$$C2 = C4 = (N-1) \cdot C$$

$$C10 = C12 = \left(\frac{1}{M-1}\right) \cdot C$$

The control circuitry configured to generate the control signals Φ1 and Φ2 (and their complements Φ1 and Φ2) for producing and refreshing the threshold voltages $V_a$ and $V_b$ for Schmitt trigger comparator 52", not visible in FIG. 19, may be the same as exemplified in FIG. 8 (e.g., including a finite state machine circuit 112, an AND logic gate 114 and optionally a frequency divider 116). Operation of the finite state machine may be the same as discussed with reference to FIG. 10.

Therefore, the charge Q1, Q2, Q3, Q4, Q9, Q10, Q11, and Q12 stored respectively in capacitors C1, C2, C3, C4, C9, Cm, C11 and C12 in each of the three operating states SA, SB and SC of the FSM 112 may be computed according to Tables I.1 and I.2 reproduced at the end of the description.

TABLE I.1

| FSM state | Q1 | Q2 | Q3 | Q4 |
|---|---|---|---|---|
| SA | $C \cdot V_{dc}$ | $(N-1) \cdot C \cdot V_{dc}$ | $C \cdot V_{dc}$ | $(N-1) \cdot C \cdot V_{dc}$ |
| SB | $C \cdot (V_{dc} - A_1)$ | $(N-1) \cdot C \cdot V_{dc}$ | $C \cdot (V_{dc} - A_1)$ | $(N-1) \cdot C \cdot V_{dc}$ |
| SC | $C \cdot (V_{dc} - A_1)$ | $(N-1) \cdot C \cdot V_{dc}$ | $C \cdot (V_{dc} - A_1)$ | $(N-1) \cdot C \cdot V_{dc}$ |

TABLE I.2

| FSM state | Q9 | Q10 | Q11 | Q12 |
|---|---|---|---|---|
| SA | $C \cdot V_{dc}$ | $\left(\frac{1}{M-1}\right) \cdot C \cdot V_{dc}$ | $C \cdot V_{dc}$ | $\left(\frac{1}{M-1}\right) \cdot C \cdot V_{dc}$ |
| SB | $C \cdot (V_{dc} - A_1)$ | $\left(\frac{1}{M-1}\right) \cdot C \cdot V_{dc}$ | $C \cdot (V_{dc} - A_1)$ | $\left(\frac{1}{M-1}\right) \cdot C \cdot V_{dc}$ |
| SC | $C \cdot (V_{dc} - A_1)$ | $\left(\frac{1}{M-1}\right) \cdot C \cdot V_{dc}$ | $C \cdot (V_{dc} - A_1)$ | $\left(\frac{1}{M-1}\right) \cdot C \cdot V_{dc}$ |

The resulting values of the threshold voltages $V_a$ and $V_b$ may thus be computed as:

$$V_a = \frac{(V_{dc} - A_1) + (N-1) \cdot V_{dc}}{N}$$

$$V_b = \frac{(M-1) \cdot (V_{dc} - A_1) + V_{dc}}{M}$$

Figure 20:
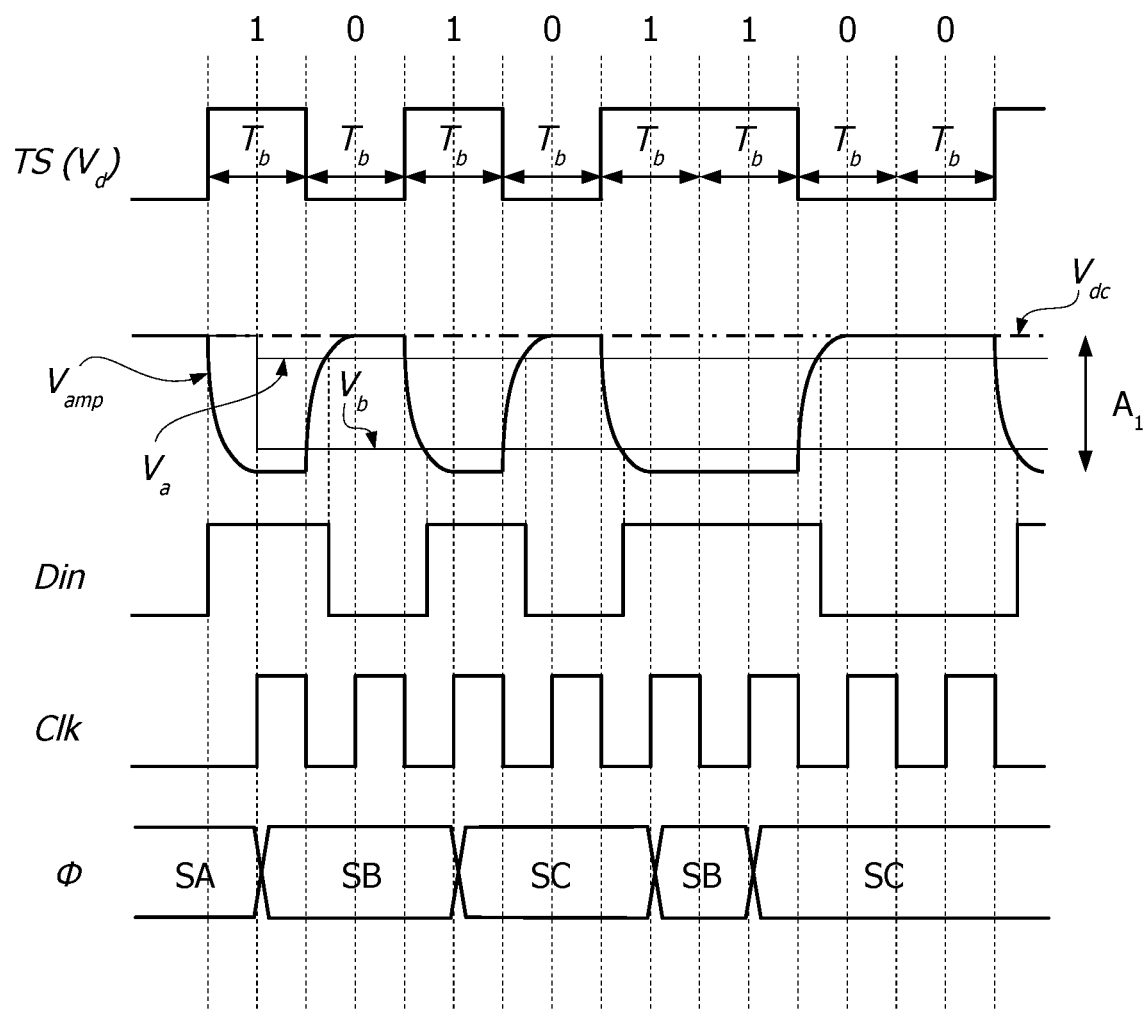
FIG. 20 is a time diagram exemplary of possible time evolution of signals in the hysteretic receiver device of FIG. 19.

Operation of receiver device 16 and threshold voltage generator circuit 190 may be further understood with reference to FIG. 20, which is a time diagram exemplary of possible time evolution of signals in the receiver device 16 of FIG. 19.

It is noted that, despite the threshold voltage refresh capability of embodiments as exemplified in FIG. 19, the configuration principle disclosed with reference to FIG. 7 could be applied to these embodiments as well.

Without prejudice to the underlying principles, the details and embodiments may vary, even significantly, with respect to what has been described by way of example only, without departing from the extent of protection.

The extent of protection is determined by the annexed claims.

What is claimed is:
1. A circuit, comprising:
 a clock input node configured to receive a clock signal;
 a first signal input node configured to receive a first modulated signal switching between a first DC voltage and a second DC voltage;

a bias circuit configured to produce a bias voltage equal to the first DC voltage;
a first output node configured to produce a first threshold voltage;
a first capacitor;
a second capacitor;
first switching circuitry coupled to the first capacitor and the second capacitor, the first switching circuitry being switchable between a first configuration and a second configuration; and
control circuitry configured to:
   initially set the first switching circuitry in the first configuration in response to the first modulated signal having the second DC voltage, thereby charging the first capacitor to the second DC voltage and charging the second capacitor to the first DC voltage, and
   subsequently set the first switching circuitry in the second configuration in response to an edge detected in the clock signal, thereby producing the first threshold voltage at the first output node after charge redistribution taking place between the first and second capacitors.

2. The circuit of claim 1, wherein the first switching circuitry is switchable between the first configuration in which a first terminal of the first capacitor is coupled to the first signal input node, a first terminal of the second capacitor is coupled to the bias circuit, and the first terminals of the first and second capacitors are decoupled from each other, and the second configuration in which the first terminal of the first capacitor is decoupled from the first signal input node, the first terminal of the second capacitor is decoupled from the bias circuit, and the first terminals of the first and second capacitors are coupled to each other and to the first output node.

3. The circuit of claim 2, comprising:
a third capacitor;
a fourth capacitor; and
second switching circuitry coupled to the third capacitor and the fourth capacitor, the second switching circuitry being switchable between a first configuration in which a first terminal of the third capacitor is coupled to the first signal input node, a first terminal of the fourth capacitor is coupled to the bias circuit, and the first terminals of the third and fourth capacitors are decoupled from each other, and a second configuration in which the first terminal of the third capacitor is decoupled from the first signal input node, the first terminal of the fourth capacitor is decoupled from the bias circuit, and the first terminals of the third and fourth capacitors are coupled to each other and to the first output node;
wherein the control circuitry is further configured to:
   initially set the second switching circuitry in the first configuration in response to the first modulated signal having the second DC voltage, thereby charging the third capacitor to the second DC voltage and charging the fourth capacitor to the first DC voltage; and
   alternately set the first switching circuitry in the second configuration and the second switching circuitry in the first configuration and then the first switching circuitry in the first configuration and the second switching circuitry in the second configuration, in response to edges detected in the clock signal, thereby producing the first threshold voltage at the first output node after charge redistribution taking place alternately between the first and second capacitors or between the third and fourth capacitors.

4. The circuit of claim 3, wherein the first, second, third, and fourth capacitors have the same capacitance value.

5. The circuit of claim 3, further comprising:
a second signal input node configured to receive a second modulated signal switching between the first DC voltage and a third DC voltage;
a second output node configured to produce a second threshold voltage;
a fifth capacitor, a sixth capacitor, a seventh capacitor, and an eighth capacitor;
third switching circuitry coupled to the fifth capacitor and the sixth capacitor, the third switching circuitry being switchable between a first configuration in which a first terminal of the fifth capacitor is coupled to the second signal input node, a first terminal of the sixth capacitor is coupled to the bias circuit, and the first terminals of the fifth and sixth capacitors are decoupled from each other, and a second configuration in which the first terminal of the fifth capacitor is decoupled from the second signal input node, the first terminal of the sixth capacitor is decoupled from the bias circuit, and the first terminals of the fifth and sixth capacitors are coupled to each other and to the second output node; and
fourth switching circuitry coupled to the seventh capacitor and the eighth capacitor, the fourth switching circuitry being switchable between a first configuration in which a first terminal of the seventh capacitor is coupled to the second signal input node, a first terminal of the eighth capacitor is coupled to the bias circuit, and the first terminals of the seventh and eighth capacitors are decoupled from each other, and a second configuration in which the first terminal of the seventh capacitor is decoupled from the second signal input node, the first terminal of the eighth capacitor is decoupled from the bias circuit, and the first terminals of the seventh and eighth capacitors are coupled to each other and to the second output node;
wherein the control circuitry is further configured to:
   initially set the third switching circuitry in the first configuration in response to the second modulated signal having the third DC voltage, thereby charging the fifth capacitor to the third DC voltage and charging the sixth capacitor to the first DC voltage;
   initially set the fourth switching circuitry in the first configuration in response to the second modulated signal having the third DC voltage, thereby charging the seventh capacitor to the third DC voltage and charging the eighth capacitor to the first DC voltage; and
   alternately set the third switching circuitry in the second configuration and the fourth switching circuitry in the first configuration and then the third switching circuitry in the first configuration and the fourth switching circuitry in the second configuration, in response to edges detected in the clock signal, thereby producing the second threshold voltage at the second output node after charge redistribution taking place alternately between the fifth and sixth capacitors or between the seventh and eighth capacitors.

6. The circuit of claim 3, comprising:
a second output node configured to produce a second threshold voltage;

a fifth capacitor, a sixth capacitor, a seventh capacitor, and an eighth capacitor;
third switching circuitry coupled to the fifth capacitor and the sixth capacitor, the third switching circuitry being switchable between a first configuration in which a first terminal of the fifth capacitor is coupled to the first signal input node, a first terminal of the sixth capacitor is coupled to the bias circuit, and the first terminals of the fifth and sixth capacitors are decoupled from each other, and a second configuration in which the first terminal of the fifth capacitor is decoupled from the first signal input node, the first terminal of the sixth capacitor is decoupled from the bias circuit, and the first terminals of the fifth and sixth capacitors are coupled to each other and to the second output node; and
fourth switching circuitry coupled to the seventh capacitor and the eighth capacitor, the fourth switching circuitry being switchable between a first configuration in which a first terminal of the seventh capacitor is coupled to the first signal input node, a first terminal of the eighth capacitor is coupled to the bias circuit, and the first terminals of the seventh and eighth capacitors are decoupled from each other, and a second configuration in which the first terminal of the seventh capacitor is decoupled from the first signal input node, the first terminal of the eighth capacitor is decoupled from the bias circuit, and the first terminals of the seventh and eighth capacitors are coupled to each other and to the second output node;
wherein the control circuitry is further configured to:
initially set the third switching circuitry in the first configuration in response to the first modulated signal having the second DC voltage, thereby charging the fifth capacitor to the second DC voltage and charging the sixth capacitor to the first DC voltage;
initially set the fourth switching circuitry in the first configuration in response to the first modulated signal having the second DC voltage, thereby charging the seventh capacitor to the second DC voltage and charging the eighth capacitor to the first DC voltage; and
alternately set the third switching circuitry in the second configuration and the fourth switching circuitry in the first configuration and then the third switching circuitry in the first configuration and the fourth switching circuitry in the second configuration, in response to edges detected in the clock signal, thereby producing the second threshold voltage at the second output node after charge redistribution taking place alternately between the fifth and sixth capacitors or between the seventh and eighth capacitors; and
wherein capacitance values C1, C2, C3, C4, C9, C10, C11 and C12 of the first, second, third, fourth, fifth, sixth, seventh and eighth capacitors are linked by the following relations:

$C1=C3=C9=C11=C$ $C2=C4=(N-1)\cdot C$ $C10=C12=(1/(M-1))\cdot C$ with $N \leq M$.

7. The circuit of claim 6, wherein the capacitance value of each of the first, second, third, fourth, fifth, sixth, seventh and eighth capacitors is configurable via a configuration signal.

8. The circuit of claim 2, comprising:
a second signal input node configured to receive a second modulated signal switching between the first DC voltage and a third DC voltage;
a second output node configured to produce a second threshold voltage;
a third capacitor;
a fourth capacitor; and
second switching circuitry coupled to the third capacitor and the fourth capacitor, the second switching circuitry being switchable between a first configuration in which a first terminal of the third capacitor is coupled to the second signal input node, a first terminal of the fourth capacitor is coupled to the bias circuit, and the first terminals of the third and fourth capacitors are decoupled from each other, and a second configuration in which the first terminal of the third capacitor is decoupled from the second signal input node, the first terminal of the fourth capacitor is decoupled from the bias circuit, and the first terminals of the third and fourth capacitors are coupled to each other and to the second output node;
wherein the control circuitry is further configured to:
initially set the second switching circuitry in the first configuration in response to the second modulated signal having the third DC voltage, thereby charging the third capacitor to the third DC voltage and charging the fourth capacitor to the first DC voltage; and
subsequently set the second switching circuitry in the second configuration in response to an edge detected in the clock signal, thereby producing the second threshold voltage at the second output node after charge redistribution taking place between the third and fourth capacitors.

9. The circuit of claim 8, wherein the first, second, third, and fourth capacitors have the same capacitance value.

10. The circuit of claim 8, further comprising:
a fifth capacitor, a sixth capacitor, a seventh capacitor, and an eighth capacitor;
third switching circuitry coupled to the fifth capacitor and the sixth capacitor, the third switching circuitry being switchable between a first configuration in which a first terminal of the fifth capacitor is coupled to the second signal input node, a first terminal of the sixth capacitor is coupled to the bias circuit, and the first terminals of the fifth and sixth capacitors are decoupled from each other, and a second configuration in which the first terminal of the fifth capacitor is decoupled from the second signal input node, the first terminal of the sixth capacitor is decoupled from the bias circuit, and the first terminals of the fifth and sixth capacitors are coupled to each other and to the second output node; and
fourth switching circuitry coupled to the seventh capacitor and the eighth capacitor, the fourth switching circuitry being switchable between a first configuration in which a first terminal of the seventh capacitor is coupled to the second signal input node, a first terminal of the eighth capacitor is coupled to the bias circuit, and the first terminals of the seventh and eighth capacitors are decoupled from each other, and a second configuration in which the first terminal of the seventh capacitor is decoupled from the second signal input node, the first terminal of the eighth capacitor is decoupled from the bias circuit, and the first terminals of the seventh and eighth capacitors are coupled to each other and to the second output node;

wherein the control circuitry is further configured to:
  initially set the third switching circuitry in the first configuration in response to the second modulated signal having the third DC voltage, thereby charging the fifth capacitor to the third DC voltage and charging the sixth capacitor to the first DC voltage;
  initially set the fourth switching circuitry in the first configuration in response to the second modulated signal having the third DC voltage, thereby charging the seventh capacitor to the third DC voltage and charging the eighth capacitor to the first DC voltage; and
  alternately set the third switching circuitry in the second configuration and the fourth switching circuitry in the first configuration and then the third switching circuitry in the first configuration and the fourth switching circuitry in the second configuration, in response to edges detected in the clock signal, thereby producing the second threshold voltage at the second output node after charge redistribution taking place alternately between the fifth and sixth capacitors or between the seventh and eighth capacitors.

11. The circuit of claim 8, further comprising:
a pair of nodes configured to receive therebetween an envelope signal indicative of a sequence of data bits;
an amplifier circuit coupled to the pair of nodes to receive the envelope signal and configured to produce, as a function thereof, the first modulated signal switching between the first DC voltage and the second DC voltage and the second modulated signal switching between the first DC voltage and the third DC voltage;
a comparator circuit configured to compare a difference between the first modulated signal and the second modulated signal to a difference between the first threshold voltage and the second threshold voltage to produce a digital data signal indicative of the sequence of data bits; and
an oscillator circuit configured to produce the clock signal received at the clock input node.

12. The circuit of claim 2, wherein the first and second capacitors have the same capacitance value.

13. The circuit of claim 2, further comprising:
a second output node configured to produce a second threshold voltage;
a third capacitor;
a fourth capacitor; and
second switching circuitry coupled to the third capacitor and the fourth capacitor, the second switching circuitry being switchable between a first configuration in which a first terminal of the third capacitor is coupled to the first signal input node, a first terminal of the fourth capacitor is coupled to the bias circuit, and the first terminals of the third and fourth capacitors are decoupled from each other, and a second configuration in which the first terminal of the third capacitor is decoupled from the first signal input node, the first terminal of the fourth capacitor is decoupled from the bias circuit, and the first terminals of the third and fourth capacitors are coupled to each other and to the second output node;

wherein the control circuitry is further configured to:
  initially set the second switching circuitry in the first configuration in response to the first modulated signal having the second DC voltage, thereby charging the third capacitor to the second DC voltage and charging the fourth capacitor to the first DC voltage; and
  subsequently set the second switching circuitry in the second configuration in response to an edge detected in the clock signal, thereby producing the second threshold voltage at the second output node after charge redistribution taking place between the third and fourth capacitors; and wherein capacitance values $C1$, $C2$, $C9$ and $C10$ of the first, second, third and fourth capacitors, respectively, are linked by the following relations:

$$C1 = C$$

$$C2 = (N-1) \cdot C$$

$$C9 = C$$

$$C10 = (1/(M-1)) \cdot C$$

with $N \leq M$.

14. The circuit of claim 13, further comprising:
a pair of nodes configured to receive therebetween an envelope signal indicative of a sequence of data bits;
an amplifier circuit coupled to the pair of nodes to receive the envelope signal and configured to produce, as a function thereof, the first modulated signal switching between the first DC voltage and the second DC voltage;
a Schmitt trigger comparator circuit configured to compare with hysteresis the first modulated signal to the first threshold voltage and the second threshold voltage to produce a digital data signal indicative of the sequence of data bits; and
an oscillator circuit configured to produce the clock signal received at the clock input node.

15. A receiver device, comprising:
a clock input node configured to receive a clock signal;
a first signal input node configured to receive a first modulated signal switching between a first DC voltage and a second DC voltage;
a bias circuit configured to produce a bias voltage equal to the first DC voltage;
a first output node configured to produce a first threshold voltage;
a first capacitor;
a second capacitor;
first switching circuitry coupled to the first capacitor and the second capacitor, the first switching circuitry being switchable between a first configuration in which a first terminal of the first capacitor is coupled to the first signal input node, a first terminal of the second capacitor is coupled to the bias circuit, and the first terminals of the first and second capacitors are decoupled from each other, and a second configuration in which the first terminal of the first capacitor is decoupled from the first signal input node, the first terminal of the second capacitor is decoupled from the bias circuit, and the first terminals of the first and second capacitors are coupled to each other and to the first output node; and
control circuitry configured to:
  initially set the first switching circuitry in the first configuration in response to the first modulated signal having the second DC voltage, thereby charging the first capacitor to the second DC voltage and charging the second capacitor to the first DC voltage, and subsequently set the first switching circuitry in the second configuration in response to an edge detected in the clock signal, thereby producing the first threshold voltage at the first output node after charge redistribution taking place between the first and second capacitors;

a pair of nodes configured to receive therebetween an envelope signal indicative of a sequence of data bits;

an amplifier circuit coupled to the pair of nodes to receive the envelope signal and configured to produce, as a function thereof, the first modulated signal switching between the first DC voltage and the second DC voltage;

a comparator circuit configured to compare the first modulated signal to the first threshold voltage to produce a digital data signal indicative of the sequence of data bits; and an oscillator circuit configured to produce the clock signal received at the clock input node.

16. The receiver device of claim 15, further comprising a logic gate arranged in a propagation path of the clock signal and configured to prevent propagation of pulses of the clock signal in response to the digital data signal being indicative of the first modulated signal assuming the first DC voltage.

17. The receiver device of claim 15, further comprising a frequency divider circuit arranged in a propagation path of the clock signal and configured to prevent propagation of a subset of pulses of the clock signal to the clock input node.

18. The receiver device of claim 15, wherein the bias circuit comprises a replica of the amplifier circuit configured to constantly output the first DC voltage of the first modulated signal to produce the bias voltage.

19. The receiver device of claim 15, wherein an output current of the bias circuit and an output current of the amplifier circuit are configurable via a configuration signal.

20. A method of operating a circuit that comprises a clock input node, a first signal input node, a bias circuit, a first output node, a first capacitor, a second capacitor, and switching circuitry coupled to the first capacitor and the second capacitor, the switching circuitry being switchable between a first configuration in which a first terminal of the first capacitor is coupled to the first signal input node, a first terminal of the second capacitor is coupled to the bias circuit, and the first terminals of the first and second capacitors are decoupled from each other, and a second configuration in which the first terminal of the first capacitor is decoupled from the first signal input node, the first terminal of the second capacitor is decoupled from the bias circuit, and the first terminals of the first and second capacitors are coupled to each other and to the first output node, the method comprising:

receiving a clock signal at the clock input node;

receiving a first modulated signal at the first signal input node, the first modulated signal switching between a first DC voltage and a second DC voltage;

providing a bias voltage equal to the first DC voltage at the bias circuit;

providing a first threshold voltage at the first output node;

initially setting the switching circuitry in the first configuration in response to the first modulated signal having the second DC voltage, thereby charging the first capacitor to the second DC voltage and charging the second capacitor to the first DC voltage; and subsequently setting the switching circuitry in the second configuration in response to an edge detected in the clock signal, thereby producing the first threshold voltage at the first output node after charge redistribution taking place between the first and second capacitors.

21. The method of claim 20, wherein the circuit further comprises a third capacitor, a fourth capacitor, and second switching circuitry being switchable between a first configuration in which a first terminal of the third capacitor is coupled to the first signal input node, a first terminal of the fourth capacitor is coupled to the bias circuit, and the first terminals of the third and fourth capacitors are decoupled from each other, and a second configuration in which the first terminal of the third capacitor is decoupled from the first signal input node, the first terminal of the fourth capacitor is decoupled from the bias circuit, and the first terminals of the third and fourth capacitors are coupled to each other and to the first output node, the method further comprising:

initially setting the second switching circuitry in the first configuration in response to the first modulated signal having the second DC voltage, thereby charging the third capacitor to the second DC voltage and charging the fourth capacitor to the first DC voltage; and alternately setting the switching circuitry in the second configuration and the second switching circuitry in the first configuration and setting the switching circuitry in the first configuration and the second switching circuitry in the second configuration in response to edges detected in the clock signal, thereby producing the first threshold voltage at the first output node after charge redistribution taking place alternately between the first and second capacitors or between the third and fourth capacitors.

22. The method of claim 20, wherein the circuit further comprises a second signal input node, a second output node, a third capacitor, a fourth capacitor, and second switching circuitry switchable between a first configuration in which a first terminal of the third capacitor is coupled to the second signal input node, a first terminal of the fourth capacitor is coupled to the bias circuit, and the first terminals of the third and fourth capacitors are decoupled from each other, and a second configuration in which the first terminal of the third capacitor is decoupled from the second signal input node, the first terminal of the fourth capacitor is decoupled from the bias circuit, and the first terminals of the third and fourth capacitors are coupled to each other and to the second output node;

receiving a second modulated signal at the second signal input node, the second modulated signal switching between the first DC voltage and a third DC voltage;

providing a second threshold voltage at the second output node;

initially setting the second switching circuitry in the first configuration in response to the second modulated signal having the third DC voltage, thereby charging the third capacitor to the third DC voltage and charging the fourth capacitor to the first DC voltage; and subsequently setting the second switching circuitry in the second configuration in response to an edge detected in the clock signal, thereby producing the second threshold voltage at the second output node after charge redistribution taking place between the third and fourth capacitors.

23. The method of claim 20, wherein the circuit further comprises a second output node, a third capacitor, a fourth capacitor, and second switching circuitry coupled to the third capacitor and the fourth capacitor, the second switching circuitry being switchable between a first configuration in which a first terminal of the third capacitor is coupled to the first signal input node, a first terminal of the fourth capacitor is coupled to the bias circuit, and the first terminals of the third and fourth capacitors are decoupled from each other, and a second configuration in which the first terminal of the third capacitor is decoupled from the first signal input node, the first terminal of the fourth capacitor is decoupled from the bias circuit, and the first terminals of the third and fourth capacitors are coupled to each other and to the second output node;

providing a second threshold voltage at the second output node;

initially setting the second switching circuitry in the first configuration in response to the first modulated signal having the second DC voltage, thereby charging the third capacitor to the second DC voltage and charging the fourth capacitor to the first DC voltage; and subsequently setting the second switching circuitry in the second configuration in response to an edge detected in the clock signal, thereby producing the second threshold voltage at the second output node after charge redistribution taking place between the third and fourth capacitors;

wherein capacitance values $C1$, $C2$, $C9$ and $C10$ of the first, second, third and fourth capacitors, respectively, are linked by the following relations:

$$C1 = C$$

$$C2 = (N-1) \cdot C$$

$$C9 = C$$

$$C10 = (1/(M-1)) \cdot C$$

with $N \leq M$.

\* \* \* \* \*